United States Patent
Kitagawa et al.

(10) Patent No.: US 8,559,253 B2
(45) Date of Patent: Oct. 15, 2013

(54) VARIABLE-RESISTANCE MEMORY DEVICE WITH CHARGE SHARING THAT DISCHARGES PRE-CHARGE VOLTAGE OF A SELECTED BIT LINE TO SHARE CHARGE WITH UNSELECTED BIT LINES

(75) Inventors: Makoto Kitagawa, Kanagawa (JP); Hiroshi Yoshihara, Nagasaki (JP)

(73) Assignee: Sony Corporation, Tokyo (JP)

( * ) Notice: Subject to any disclaimer, the term of this patent is extended or adjusted under 35 U.S.C. 154(b) by 198 days.

(21) Appl. No.: 13/067,933

(22) Filed: Jul. 8, 2011

(65) Prior Publication Data
US 2012/0026777 A1     Feb. 2, 2012

(30) Foreign Application Priority Data
Jul. 29, 2010     (JP) .................................. 2010-170934

(51) Int. Cl.
*G11C 7/00*     (2006.01)

(52) U.S. Cl.
USPC .......................................................... 365/203

(58) Field of Classification Search
USPC ............................................. 365/203 O, 203
See application file for complete search history.

(56) References Cited

U.S. PATENT DOCUMENTS

| | | | |
|---|---|---|---|
| 6,021,085 A * | 2/2000 | Goto | 365/230.03 |
| 6,600,672 B2 * | 7/2003 | Hayashi | 365/104 |
| 8,130,578 B2 * | 3/2012 | Won | 365/203 |

FOREIGN PATENT DOCUMENTS

| | | |
|---|---|---|
| JP | 2005-310196 | 11/2005 |
| JP | 2006-127672 | 5/2006 |

OTHER PUBLICATIONS

K. Aratani, et al., "A novel resistance memory with high scalability and nonosecond switching", Technical Digest IEDM2007, pp. 783-786.

* cited by examiner

*Primary Examiner* — Vanthu Nguyen
(74) *Attorney, Agent, or Firm* — Rader, Fishman & Grauer PLLC

(57) ABSTRACT

A variable-resistance memory device that includes a memory-cell array employing a plurality of memory cells each including a storage element and an access transistor. The storage element has a resistance varying in accordance with the direction of a voltage applied to the storage element and the access transistor is connected in series to the storage element between a bit line and a source line. A voltage supplying circuit sets a read voltage used for reading out the resistance of the storage element on a selected bit line connected to the memory cell serving as a read object in an operation to supply the read voltage to the selected bit line.

11 Claims, 24 Drawing Sheets

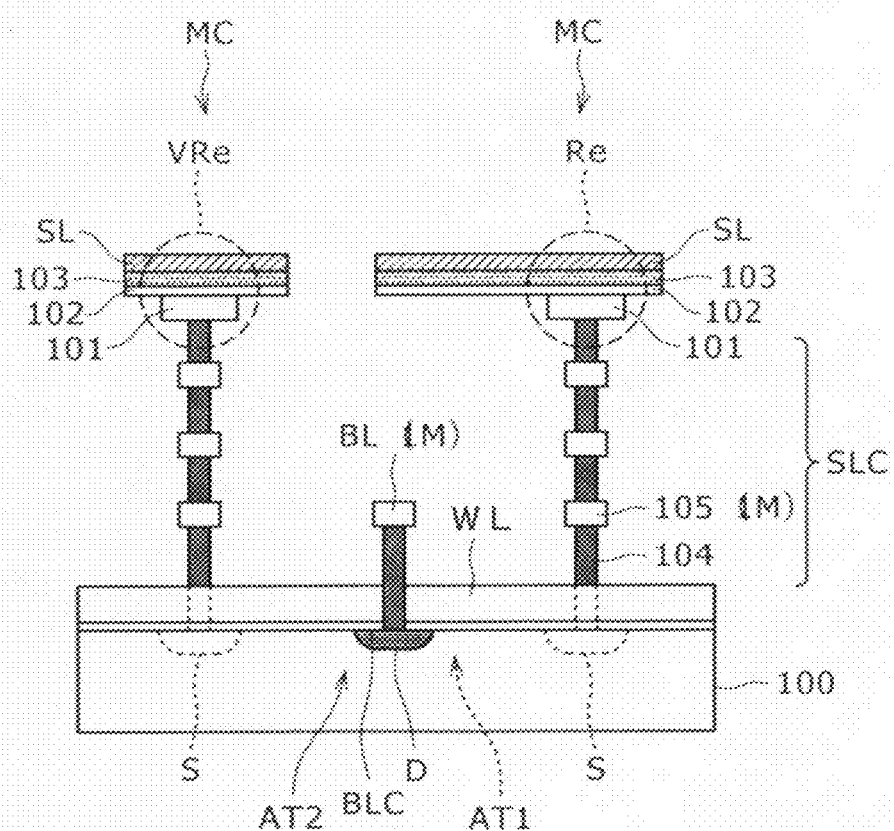

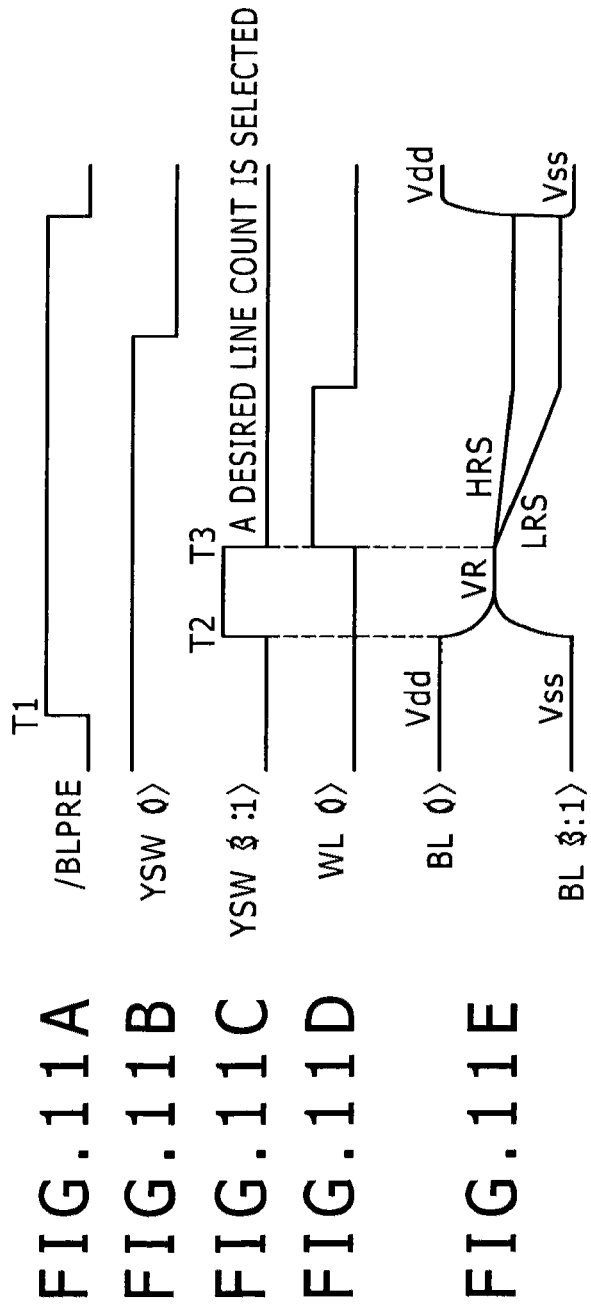

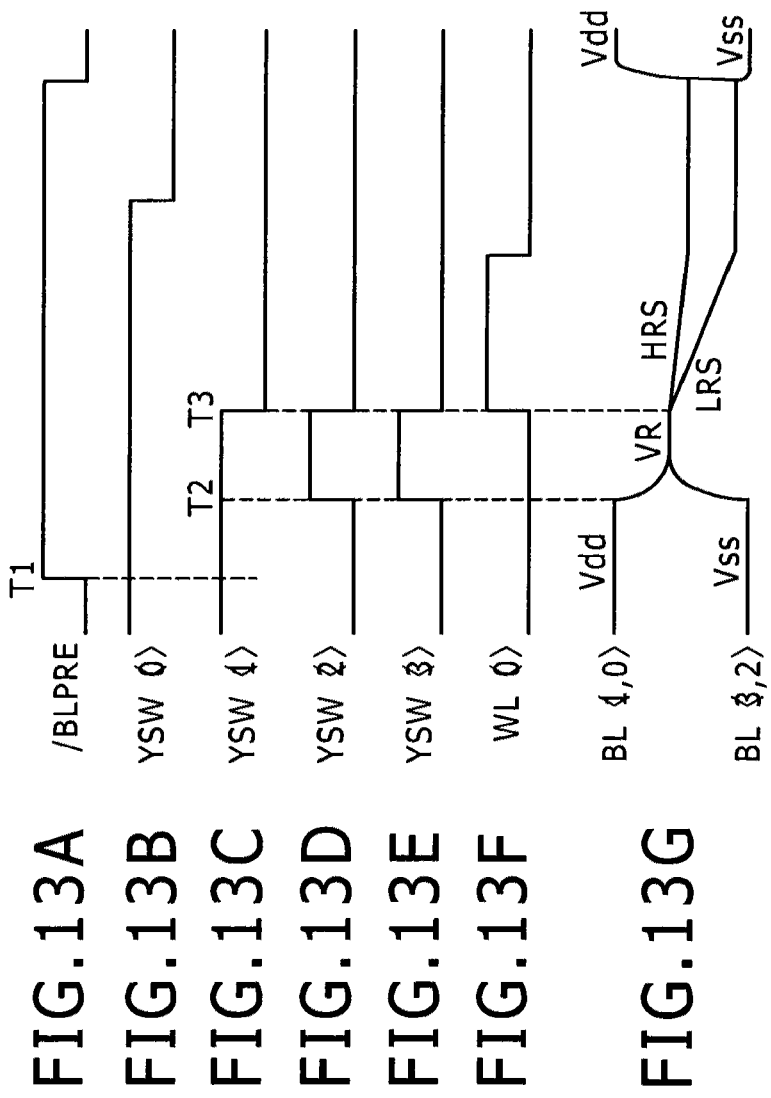

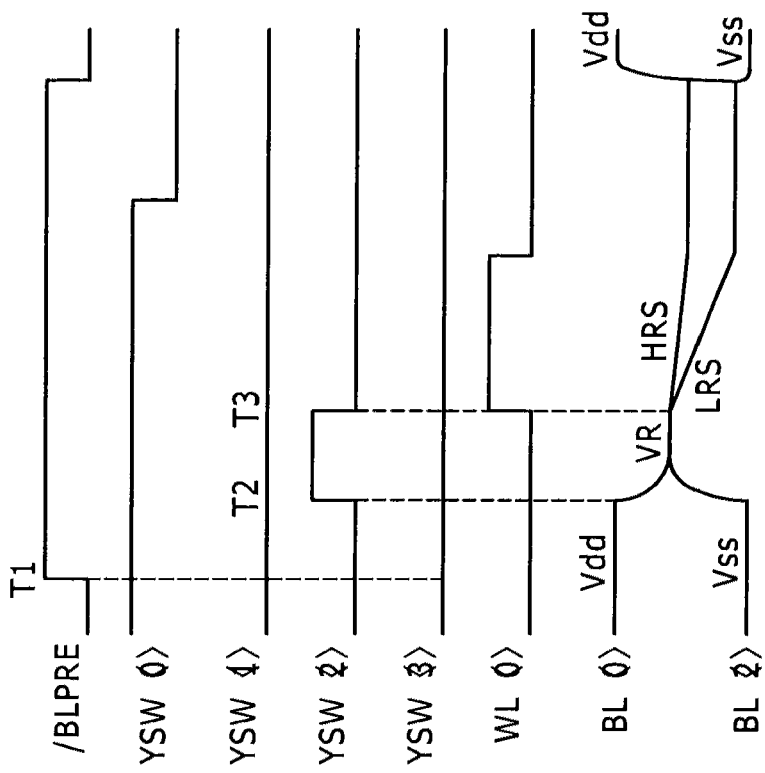

FIG.15A
FIG.15B
FIG.15C
FIG.15D
FIG.15E
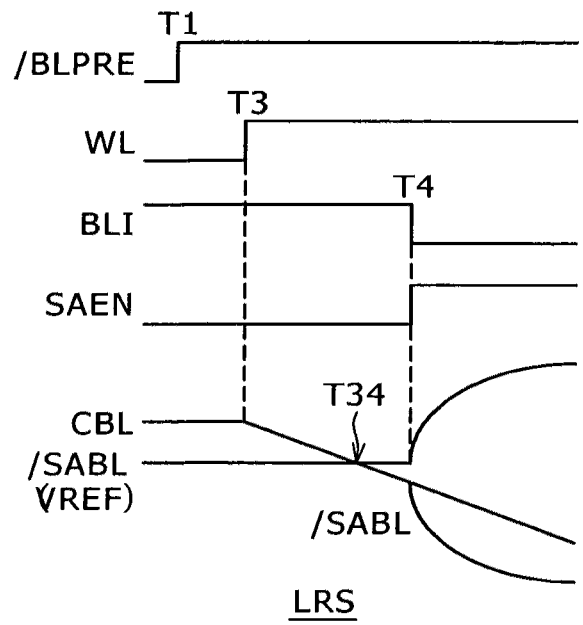
LRS
FIG.16A
FIG.16B
FIG.16C
FIG.16D
FIG.16E
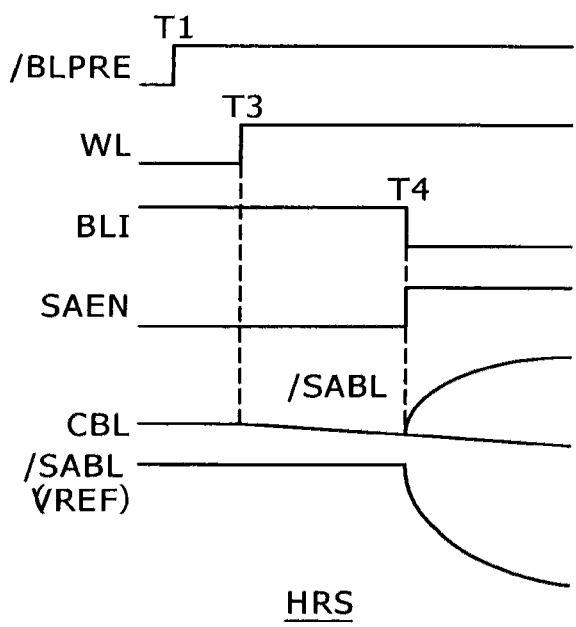
HRS

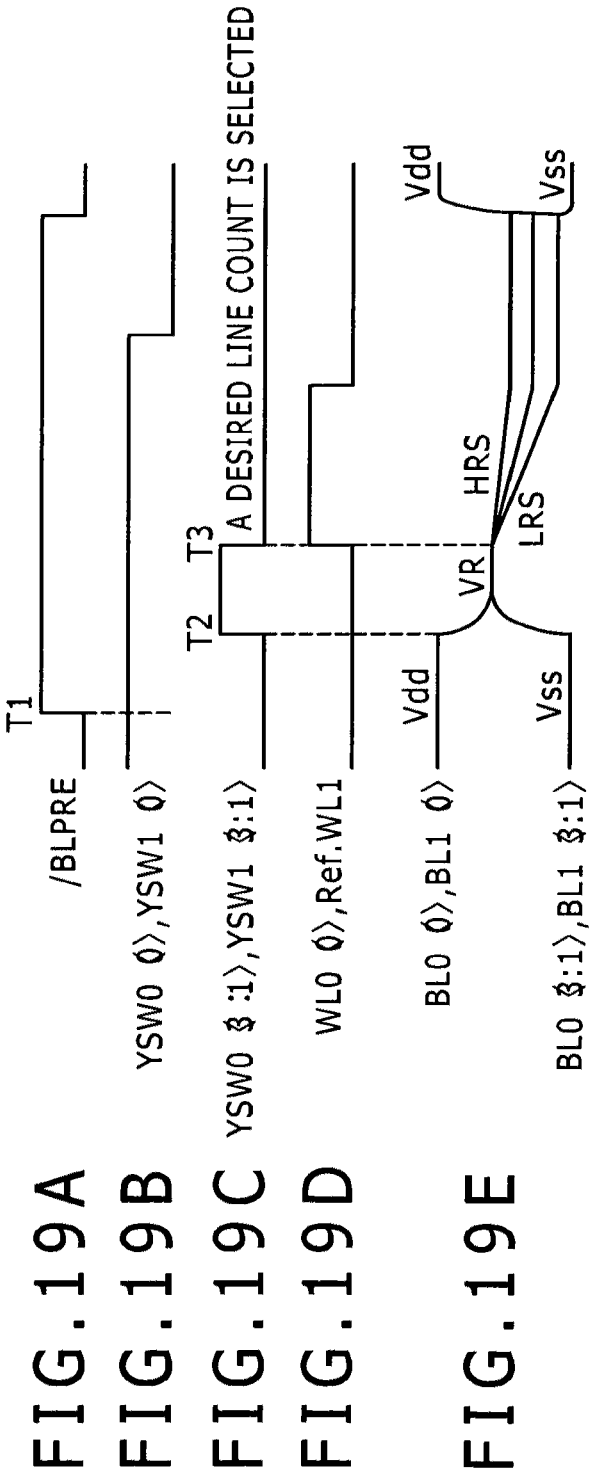

FIG.20A
FIG.20B
FIG.20C
FIG.20D
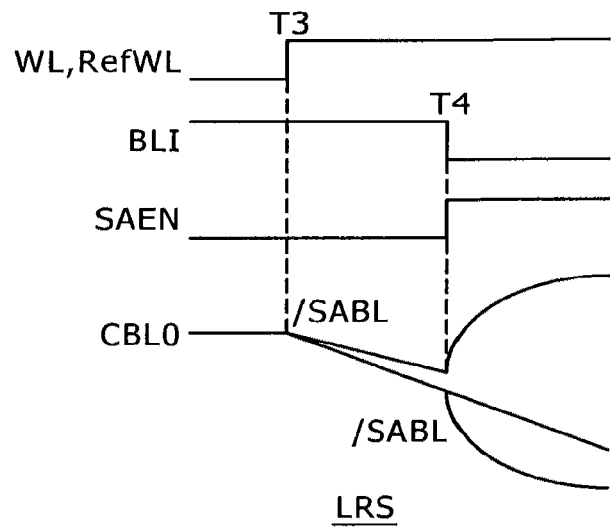
FIG.21A
FIG.21B
FIG.21C
FIG.21D
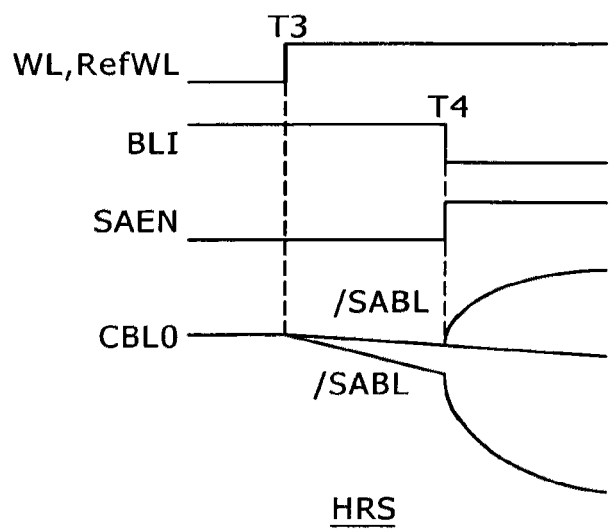

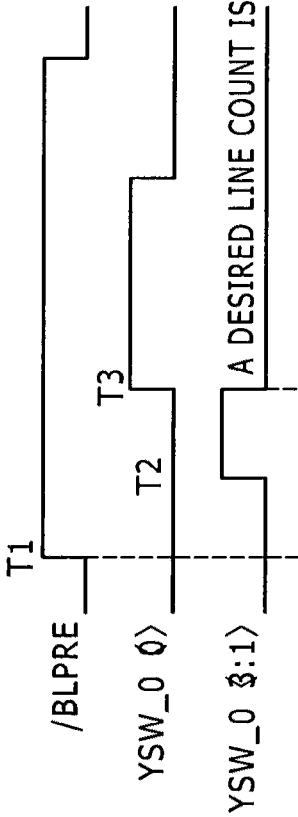
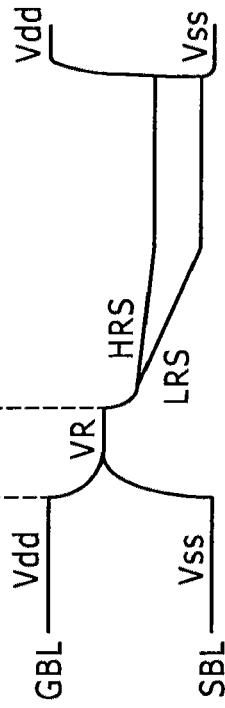
FIG.28A
FIG.28B
FIG.28C
FIG.28D
FIG.28E
FIG.28F
FIG.28G
FIG.28H

VARIABLE-RESISTANCE MEMORY DEVICE WITH CHARGE SHARING THAT DISCHARGES PRE-CHARGE VOLTAGE OF A SELECTED BIT LINE TO SHARE CHARGE WITH UNSELECTED BIT LINES

BACKGROUND

The present disclosure relates to a variable-resistance memory device employing memory cells each including a storage element having a resistance varying in accordance with a voltage applied to the storage element and an access transistor connected in series to the storage element. The present disclosure also relates to a method for driving the variable-resistance memory device.

As described in documents such as K. Aratani, K. Ohba, T. Mizuguchi, S. Yasuda, T. Shiimoto, T. Tsushima, T. Sone, K. Endo, A. Kouchiyama, S. Sasaki, A. Maesaka, N. Yamada and H. Narisawa: 'A Novel Resistance Memory with High Scalability and Nanosecond Switching', Technical Digest IEDM 2007, pp. 783-786, there is known a variable-resistance memory device employing memory cells each including a storage element. In each of the memory cells, by injecting conductive ions into an insulation film of the storage element or extracting conductive ions from the insulation film, the resistance of the storage element can be changed.

The storage element has a structure created by laminating a conductive-ion supplying layer, which serves as a layer for supplying the conductive ions, on the insulation layer between two electrodes. The memory cells are each configured to have such a storage element and an access transistor connected to the storage element in series between first and second common lines which can be driven by adoption of an active-matrix method.

Since such a memory cell thus has one transistor T and one variable resistor R of the storage element, the variable-resistance memory device is one of current-driven memories of the 1T1R type. This variable-resistance memory device is referred to as a ReRAM.

In the ReRAM, the magnitude of the resistance of the storage element indicates whether data has been written into the storage element or deleted from the storage element. A pulse with a short duration time of the nanosecond order can be used for carrying out an operation to write data into the storage element or erase data from the storage element. Thus, serving as an NVM (nonvolatile memory) capable of operating at a high speed like a RAM (Random Access Memory), the ReRAM draws much attention.

In a read or read-to-verify operation carried out on the ReRAM, a voltage is applied between the two electrodes of the storage element and a current flowing through the storage element as a result of applying the voltage is read out. In the following description, the read-to-verify operation is also referred to simply as a verify operation. The verify operation can be a verify operation carried out after an erase operation or a verify operation carried out after a write operation. However, the post-erase verify operation is basically the same as the post-write verify operation even though the polarity of the applied voltage in the former verify operation is different from the polarity of the applied voltage in the latter verify operation. That is to say, the direction of the flowing current in the post-erase verify operation is different from the direction of the flowing current in the post-write verify operation.

In addition, without regard to the type of the verify operation, it is necessary to limit the voltage applied in the verify operation to a relatively low read voltage VR in order to prevent a disturbance from occurring inadvertently. This is because an excessively large voltage applied in the verify operation may give rise to such a disturbance which causes data to be inadvertently erased from the storage element or inadvertently written into the storage element.

As a method for controlling a voltage applied to a bit line during a verify operation, there are known methods disclosed in Japanese patent Laid-open No. 2006-127672 (Patent Document 1) and Japanese patent Laid-open No. 2005-310196 (Patent Document 2) described below.

In accordance with the method disclosed in Patent Document 1, an NMOS transistor having a gate voltage set at VBIAS is provided on a read current path. The source electrode of the NMOS transistor is connected to the bit line in order to control the BL electric potential appearing on the bit line. At that time, the NMOS transistor operates as a source follower controlling the BL voltage to (VBIAS-Vgs) where symbol Vgs denotes a voltage appearing between the source and gate electrodes of the NMOS transistor.

In accordance with the method disclosed in Patent Document 2, on the other hand, a read voltage VR is generated as a fraction of a voltage obtained as a result of electrically charging a node determined in advance. The fraction is determined by a capacitance ratio. Then, in a state of dynamically holding the read voltage VR, a negative-feedback operational amplifier is used to clamp the BL voltage to the read voltage VR. That is to say, the negative-feedback operational amplifier operates as an amplifier for controlling the BL voltage to the read voltage VR. Thus, in accordance with the method disclosed in Patent Document 2, the magnitude of a cell current flowing through a memory cell is detected as a value determined by the following relation:

Cell current=Read voltage $VR$/Storage-element resistance

SUMMARY

In the case of the method disclosed in Patent Document 1, a VBIAS generation circuit is required and the VBIAS generation circuit must be a high-precision analog circuit. Thus, even in a standby state, a DC current flows, serving as one of causes of a barrier to an effort to lower the power consumption.

In the case of the method disclosed in Patent Document 2, on the other hand, an analog circuit for generating a low read voltage VR as only a fraction determined by a capacitance ratio is required. In this case, the power consumption can be reduced.

Since a DC current is generated by an operational amplifier serving as a feedback element, however, the standby current does not become equal to zero completely. Thus, there is also a barrier to an effort to further reduce the power consumption.

It is thus an aim of the present disclosure to implement a variable-resistance memory device which does not require an analog circuit for reducing the power consumption.

A variable-resistance memory device according to the present disclosure employs:

a memory-cell array including a plurality of memory cells each including a storage element having a resistance varying in accordance with the direction of a voltage applied to the storage element and an access transistor connected in series to the storage element between a bit line and a source line; and a voltage supplying circuit for setting a read voltage used for reading out the resistance of the storage element on a selected bit line connected to the memory cell serving as a read object in an operation to supply the read voltage to the selected bit line by electrically pre-charging electric charge to any arbitrary number of common lines each connected to a plurality of aforementioned bit lines as a common line common to the bit lines and/or any arbitrary number of aforementioned bit lines and by electrically discharging the electrically pre-charged electric charge to any arbitrary number of other aforementioned bit lines including the selected bit line in order to share the electric charge in an electric-charge sharing process.

In the configuration described above, the read voltage is determined by a ratio of capacitances of line capacitors used for storing electric charge before and after electrical discharging of the electric charge from common lines and bit lines as well as other bit lines. Thus, the magnitude of the read voltage can be set arbitrarily by executing control to select an electrical pre-charge object and an electrical discharge object so as to set the ratio at a proper value.

In accordance with the present disclosure, it is possible to implement a variable-resistance memory device which does not require an analog circuit and is thus capable of reducing power consumption.

BRIEF DESCRIPTION OF THE DRAWINGS

FIG. 2 is a cross-sectional diagram showing the structure of two adjacent memory cells of a variable-resistance memory device;

FIGS. 11A to 11E are timing diagrams showing waveforms for first typical operations;

FIGS. 13A to 13G are timing diagrams showing waveforms for third typical operations;

FIGS. 14A to 14G are timing diagrams showing waveforms for fourth typical operations;

FIGS. 15A to 15E are timing diagrams showing waveforms of the operation of a sense amplifier in the fourth typical operation;

FIGS. 16A to 16E are timing diagrams showing waveforms of the operation of a sense amplifier in the fourth typical operation;

FIGS. 19A to 19E are timing diagrams showing waveforms of operations for a case in which memory blocks are subjected to setting of the read voltage in a way similar to the first typical operations performed by the first embodiment as explained earlier by referring to FIGS. 11A to 11E;

FIGS. 20A to 20D are timing diagrams showing waveforms for a sensing operation in an LRS;

FIGS. 21A to 21D are timing diagrams showing waveforms for a sensing operation in an HRS;

FIGS. 28A to 28H are timing diagrams showing waveforms for operations carried out by a modified version.

DETAILED DESCRIPTION OF THE PREFERRED EMBODIMENTS

Figure 1A:
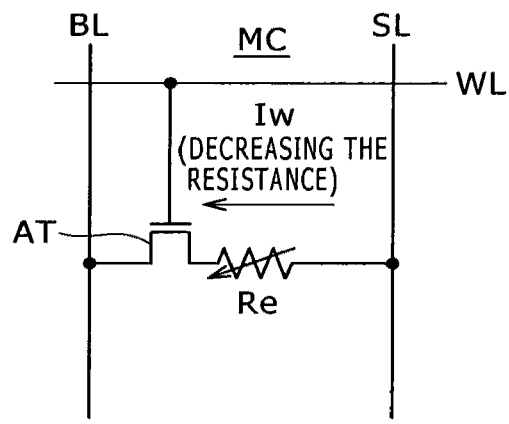
FIGS. 1A and 1B are diagrams each showing an equivalent circuit of a memory cell common to embodiments.
Figure 1B:
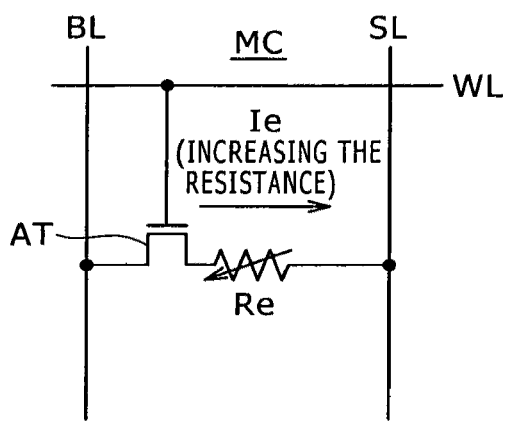

Embodiments of the present disclosure are explained by referring to the diagrams in chapters arranged as follows:
1: First Embodiment
2: Second Embodiment
3: Third Embodiment
4: Fourth Embodiment
5: Fifth Embodiment
6: Modifications 1: First Embodiment Memory-Cell Configuration FIGS. 1A and 1B are each a diagram showing an equivalent circuit of a memory cell common to embodiments. It is to be noted that FIG. 1A shows an equivalent circuit with a write current whereas FIG. 1B shows an equivalent circuit with an erase current. However, the memory-cell configurations themselves shown in the figures are identical to each other.

The memory cell MC shown in FIGS. 1A and 1B employs a variable-resistance storage resistor Re functioning as a storage element and an access transistor AT. In the following description, the variable-resistance storage resistor Re is also referred to as a variable-resistance storage element Re.

One of the two ends of the variable-resistance storage element Re is connected to a source line SL whereas the other end is connected to the source electrode of the access transistor AT. The drain electrode of the access transistor AT is connected to a bit line BL whereas the gate electrode of the access transistor AT is connected to a word line WL.

In the configuration shown in FIGS. 1A and 1B, the bit line BL and the source line SL are parallel to each other. It is to be noted, however, that the bit line BL and the source line SL do not have to be parallel to each other.

In the first embodiment, in a 3-line configuration given as a premise, as described above, the memory cell MC is connected to three lines, i.e., the bit line BL, the source line SL and the word line WL used for controlling the access transistor AT.

FIG. 2 is a cross-sectional diagram showing the structure of two adjacent memory cells MC of a variable-resistance memory device. FIG. 2 is a model cross-sectional diagram showing no hatched portions. Blank portions of FIG. 2 are portions filled up with insulation films or other configuration portions even though the figure does not indicate so.

In the memory cell MC shown in FIG. 2, the access transistor AT of the memory cell MC is created on a substrate 100.

To put it in detail, two impurity areas serving as the source electrode S of the access transistor AT which is AT1 or AT2 and the drain electrode D of the access transistor AT respectively are created on the substrate 100 whereas a gate electrode G is created from poly-silicon or the like on a gate substrate area between the source electrode S and the drain electrode D. The gate electrode G is separated away from the gate area on the substrate 100 by a gate insulation film. The gate electrode G forms a word line WL stretched in the row direction, that is, the horizontal direction in FIG. 2. The impurity area used as the drain electrode D is placed on the front side of the word line WL whereas the impurity area used as the source electrode S is placed on the rear side of the word line WL. The front side of the word line WL is the front side in a direction perpendicular to the surface of the page showing the diagram whereas the rear side of the word line WL is the rear side in a direction perpendicular to the surface of the page showing the diagram. In FIG. 2, the positions of the impurity area used as the drain electrode D and the impurity area used as the source electrode S are shifted from each other in the horizontal direction in order to make the drain electrode D and the source electrode S easy to identify. However, the positions of the impurity area used as the drain electrode D and the impurity area used as the source electrode S can also overlap each other in a direction perpendicular to the surface of the page showing the diagram.

The drain electrode D is connected to the bit line BL created by a first wire layer (1M) through a bit-line contact BLC.

On the source electrode S, a source-line contact SLC is created by repeatedly piling up plugs 104 and landing pads 105. The landing pads 105 are each created from a wire layer. On the source-line contact SLC, the variable-resistance storage element Re is created.

It is possible to arbitrarily select a layer from a multi-layer wire structure to serve as a layer on which the variable-resistance storage element Re is to be created. In this case, however, the fourth or fifth layer is selected to serve as a layer on which the variable-resistance storage element Re is to be created.

The variable-resistance storage element Re forms a film configuration (or a laminated body) between a lower electrode 101 and a top electrode serving as the source line SL. The film configuration includes an insulation-body film 102 and a conductor film 103.

Typical examples of a material used for making the insulation-body film 102 typically include SiN, $SiO_2$ and $Gd_2O_3$.

Typical examples of a material used for making the conductor film 103 typically include a metal film, an alloy film and a metal compound film. The metal film includes one or more elements selected from Cu, Ag, Zr and Al. A typical example of the alloy film is the CuTe alloy film. It is to be noted that the elements for making the metal film can also be selected from elements other than Cu, Ag, Zr and Al provided that the elements have a property of being easy to ionize. In addition, it is desirable to make use of one or more elements S, Se and Te to serve as elements to be combined with one or more aforementioned elements Cu, Ag, Zr and Al. The conductor film 103 is created as a conductive-ion supplying layer.

FIG. 2 shows two variable-resistance elements Re connected to different source lines SL. The insulation-body films 102 each serving as one of the storage layers of adjacent memory cells MC separated away from each other in the same direction as the bit line BL are created on the same layer. By the same token, the conductor films 103 each serving as one of the conductive-ion supplying layers of these memory cells MC are also created on the same layer. In the same way, the source lines SL of these memory cells MC are also created on the same layer. In addition, as another configuration, the source line SL is shared by memory cells MC separated away from each other in the same direction as the bit line BL whereas the storage layer and the conductive-ion supplying layer are each created independently for every memory cell MC.

It is to be noted that, in the first embodiment, the source line SL is created by a wire layer above the bit line BL. The bit line BL is created by the first wire layer (1M) whereas the source line SL is created by the fourth or fifth wire layer. However, the source line SL can be created by the first wire layer (1M) whereas the bit line BL can be created by the fourth or fifth wire layer. In addition, the wire layers used for creating the source line SL and the bit line BL can be selected arbitrarily.

Figure 3A:
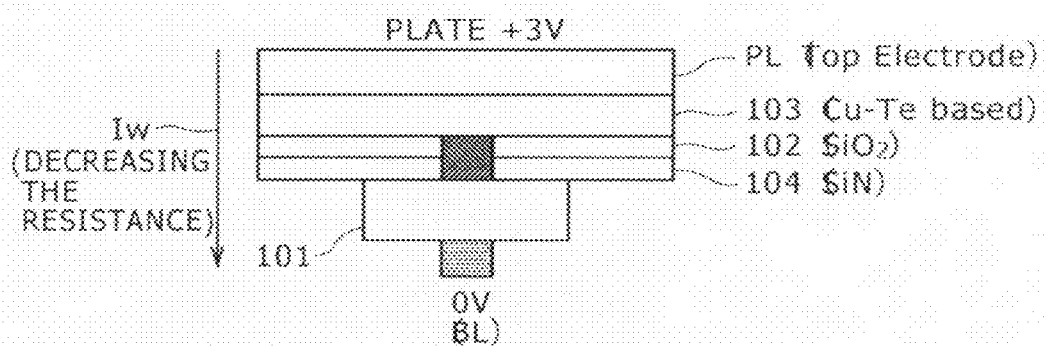
FIGS. 3A and 3B are model diagrams each showing the direction of a current flowing through a variable-resistance storage element employed in a memory cell and a typical magnitude of a voltage applied to the variable-resistance storage element.
Figure 3B:
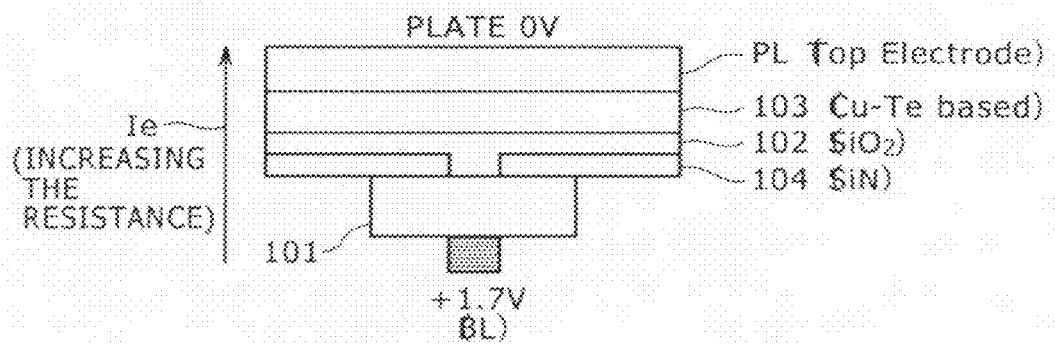

FIGS. 3A and 3B are model diagrams each showing the direction of a current flowing through a variable-resistance storage element Re employed in a variable-resistance memory device and a typical magnitude of a voltage applied to the variable-resistance storage element.

As an example, FIGS. 3A and 3B show a configuration in which the insulation-body film 102 is created from $SiO_2$ whereas the conductor film 103 is created from a Cu—Te based alloy compound material. The insulation-body film 102 has an area of contact with the lower electrode 101. The area of contact is defined by an aperture on a nitride film (or an SiN film) 104.

To be more specific, FIG. 3A shows a case in which a voltage is applied between the lower electrode 101 and the top electrode serving as the source line SL in a direction that puts the insulation-body film 102 on the negative-electrode side and the conductor film 103 on the positive-electrode side. For example, with such a voltage, the bit line BL is connected to the ground having an electric potential of 0 V whereas the source line SL is set at a typical electric potential of +3 V.

Such a state gives rise to a property showing a phenomenon in which Cu, Ag, Zr or Al included in the conductor film 103 is ionized and the resulting ions are attracted to the negative-electrode side. These conductive ions of the metal are injected into the insulation-body film 102. Thus, the insulation power of the insulation-body film 102 decreases and, in consequence, the insulation-body film 102 exhibits a conductive characteristic. As a result, a write current Iw having a direction shown in FIG. 3A flows. This operation is referred to as a write operation or a set operation.

Conversely to what is described above, FIG. 3B shows a case in which a voltage is applied between the lower electrode 101 and the top electrode serving as the source line SL in a direction that puts the conductor film 103 on the negative-electrode side and the insulation-body film 102 on the positive-electrode side. For example, with such a voltage, the source line SL is connected to the ground having an electric potential of 0 V whereas the bit line BL is set at a typical electric potential of +1.7 V.

Such a state gives rise to a phenomenon in which the conductive ions injected into the insulation-body film 102 are returned to the conductor film 103, restoring the resistance to a high pre-write value. This operation is referred to as an erase operation or a reset operation. In the erase or reset operation, an erase current Ie having a direction shown in FIG. 3B flows.

It is to be noted that, in the following description, the set operation is defined as an operation to inject sufficient conductive ions into the insulation-body film whereas the reset operation is defined as an operation to extract sufficient conductive ions from the insulation-body film.

On the other hand, the set operation can be regarded arbitrarily as a data writing operation whereas the reset operation can be regarded arbitrarily as a data erasing operation or vice versa.

In the following description, the set operation is regarded as a data writing operation whereas the reset operation is regarded as a data erasing operation. That is to say, the data writing operation or the set operation is defined as an operation to reduce the insulation property of the insulation-body film 102 so as to decrease the resistance of the entire variable-resistance storage element Re to a sufficiently low level whereas the data erasing operation or the reset operation is defined as an operation to restore the insulation property of the insulation-body film 102 to the original initial state so as to increase the resistance of the entire variable-resistance storage element Re to a sufficiently high level.

The current directions indicated by arrows shown in FIGS. 1A and 3A are the directions of the write current Iw flowing through the variable-resistance storage element Re in the set operation whereas the current directions indicated by arrows shown in FIGS. 1B and 3B are the directions of the erase current Ie flowing through the variable-resistance storage element Re in the reset operation.

It is thus possible to implement a binary memory on which the set and reset operations described above are repeatedly carried out in order to change the resistance of the variable-resistance storage element Re from a large value to a small value and vice versa in a reversible manner. On top of that, since the variable-resistance storage element Re sustains the resistance thereof or data stored therein even if the voltage applied to the variable-resistance storage element Re is removed, the binary memory functions as a nonvolatile memory.

However, in addition to the binary memory, the present disclosure can also be applied to a multi-value memory such as a memory capable of storing three or more values.

It is to be noted that, in a set operation, the resistance of the variable-resistance storage element Re changes actually in accordance with the number of metal ions injected into the insulation-body film 102. Thus, the insulation-body film 102 can be regarded as a storage layer used for storing and holding data.

It is possible to configure a memory-cell array of a variable-resistance memory device to include a number of memory cells MC each employing a variable-resistance storage element Re. The variable-resistance memory device itself is configured to include the memory-cell array and a driving circuit also referred to as a peripheral circuit.

Configuration of the IC Chip

Figure 4:
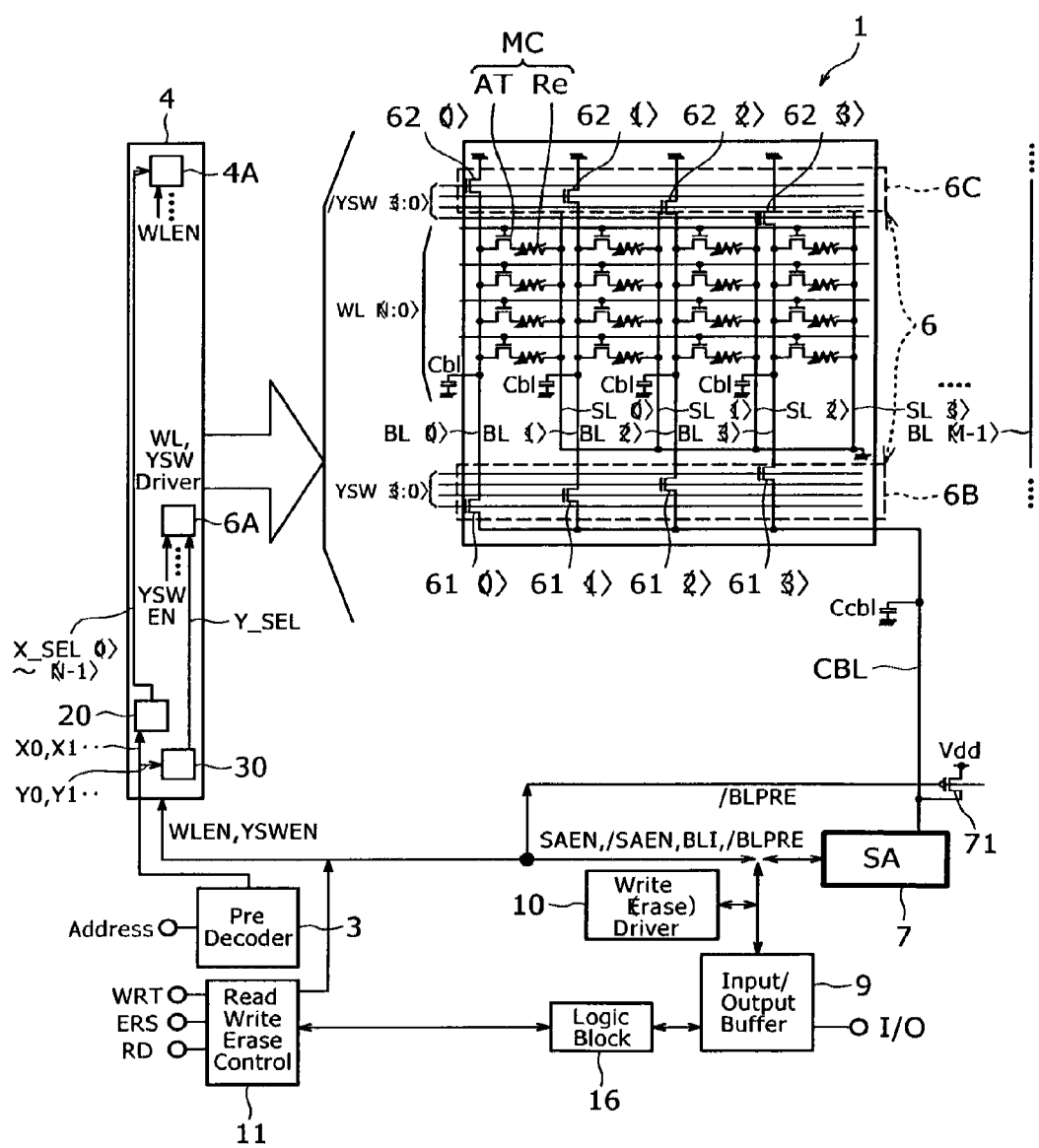
FIG. 4 is a block diagram showing a variable-resistance memory device according to a first embodiment.

FIG. 4 is a block diagram showing the configuration of a variable-resistance memory device implemented typically as an IC chip.

The variable-resistance memory device shown in FIG. 4 employs a memory-cell array 1 and its peripheral circuit which are integrated in the same semiconductor chip. The memory-cell array 1 is constructed by arranging the memory cells MC shown in FIGS. 1A to 3B to form a matrix composed of N rows each including M memory cells MC arranged in the row direction and M columns each including N memory cells MC arranged in the column direction. In this case, symbols M and N are each a relatively large integer that can be set arbitrarily at a concrete value.

It is to be noted that FIG. 4 shows a typical configuration of a portion of the memory-cell array 1. This portion includes memory cells MC arranged to form N rows and four columns. In this typical configuration, data of four memory cells MC arranged in the row direction on each of the rows is read out by one sense amplifier.

Since there are N rows in the portion shown in FIG. 4 as a portion of the memory-cell array 1, N word lines WL<0> to WL<N-1> are used for the N rows respectively. The N word lines WL<0> to WL<N-1> are laid out at predetermined intervals in the column direction. In FIG. 4, N word lines WL<0> to WL<N-1> are denoted by reference symbol WL<N:0>. The gate electrodes of the access transistors AT in four memory cells MC arranged in the row direction on each of N rows are connected to each other by a word line WL<N:0>.

In addition, the drain or source electrodes of the access transistors AT in N memory cells MC arranged in the column direction are connected to each other by a bit line BL. Since there are M columns in the memory-cell array 1, M bit lines BL<0> to BL<M-1> are used. The M bit lines BL<0> to BL<M-1> are laid out at predetermined intervals in the row direction.

In the same way, specific ends of the variable-resistance elements Re in N memory cells MC arranged in the column direction are connected to each other by a source line SL. Since there are M columns in the memory-cell array 1, M source lines SL<0> to SL<M-1> not shown in FIG. 4 are used. The M source lines SL<0> to SL<M-1> are laid out at predetermined intervals in the row direction. The specific end of the variable-resistance storage element Re employed in every memory cell MC is the end on a side opposite to the access transistor AT employed in the same memory cell MC.

Typically, four source lines included in the M source lines SL<0> to SL<M-1> as four source lines provided for four adjacent columns respectively are connected to each other. Such four source lines can be connected to a line for supplying a reference voltage such as the GND (ground) voltage. The bit lines BL and the source lines SL are laid out alternately in the row direction.

The peripheral circuit has write/erase drivers 10 and sense amplifiers (SA) 7. Each write/erase driver 10 drives a bit line BL and a source line SL. An SA (sense amplifier) 7 reads out data from a bit line BL.

A write/erase driver 10 and an SA (sense amplifier) 7 form a column driving circuit. The column driving circuit corresponds to a main section of a driving circuit according to the present disclosure. It is to be noted that the driving circuit according to the embodiments of the present disclosure includes the write/erase driver 10 but does not have to include the SA (sense amplifier) 7.

In the configuration shown in FIG. 4, each source line SL is connected to the ground. However, the connection of each source line SL to the ground merely shows a model of a voltage application state in a read operation. In actuality, each source line SL is connected to an erase driver 10 by a select switch assigned individually to the source line SL. However, the select switch itself is not shown in FIG. 4.

In addition, the peripheral circuit also has a pre-decoder 3, a row driving circuit 4 and a column switch circuit 6.

The pre-decoder 3 is a circuit for splitting an input address signal into a row address of an X system and a column address of a Y system.

The row driving circuit 4 has an X-address main decoder, a Y-address main decoder, a column-switch control circuit and a WL (word line) driver.

The column switch circuit 6 is a circuit for controlling operations to connect a predetermined plurality of bit lines BL to a common bit line CBL or a line for supplying a reference voltage such as the GND (ground) voltage and disconnect the bit limes BL from the common bit line CBL or the line for supplying the reference voltage. In the case of the configuration shown in FIG. 4, the predetermined plurality is typically 4. That is to say, the bit lines BL are bit lines BL<0> and BL<3>.

On top of that, the peripheral circuit also has an I/O (input/output) buffer 9, a control circuit 11 and a logic block 16.

The logic block 16 is a logic circuit section of a control system for controlling operations to input and output data, an operation to save data and a buffering operation. If necessary, the logic block 16 can also be configured to carry out control of a write inhibit state for every column of the memory-cell array 1.

It is to be noted that FIG. 4 does not show other circuits such as a circuit for generating a variety of voltages from the voltage of a power supply and a circuit for controlling generation of a clock signal.

Figure 5:
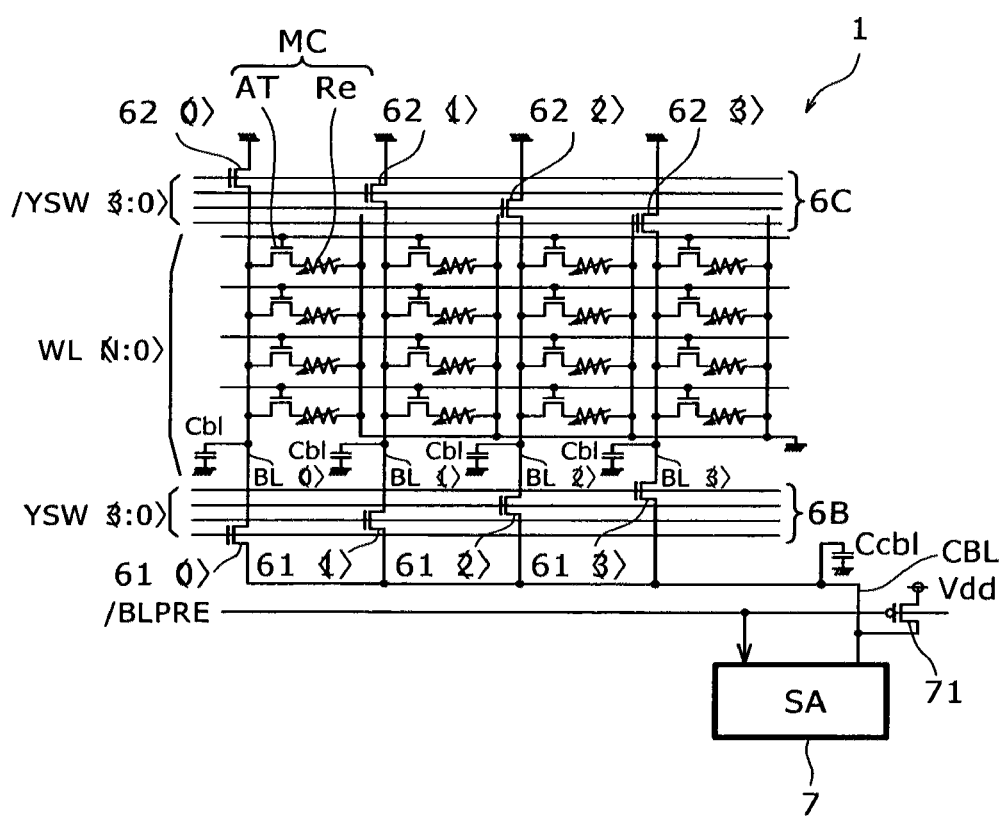
FIG. 5 is an enlarged diagram showing a memory-cell array employed in the variable-resistance memory device shown in FIG. 4.

Next, the configuration of the column switch circuit 6 shown in FIGS. 4 and 5 is explained as follows. FIG. 5 is a diagram showing connections among the memory-cell array 1, the SA (sense amplifier) 7 and each other section which are shown in FIG. 4.

As shown in FIGS. 4 and 5, the column switch circuit 6 has a common-line isolation switch section 6B and a discharge switch section 6C.

The common-line isolation switch section 6B is a collection of four NMOS switches for connecting four bit lines BL<3:0> respectively to the common bit line CBL and disconnecting the four bit lines BL<3:0> respectively from the common bit line CBL. The four bit lines BL<3:0> are bit lines BL<0> to BL<3>. The bit line BL<0> is a bit line having the smallest bit-line number whereas the bit line BL<3> is a bit line having the largest bit-line number among the four bit lines BL<3:0>. In the following description, the four NMOS switches are referred to as isolation switches 61<3:0>.

The isolation switch 61<0> is connected between the bit line BL<0> and the common bit line CBL and controlled by a column select signal YSW<0> supplied to the gate electrode of the isolation switch 61<0>. By the same token, the isolation switch 61<1> is connected between the bit line BL<1> and the common bit line CBL and controlled by a column select signal YSW<1> supplied to the gate electrode of the isolation switch 61<1>. In the same way, the isolation switch 61<2> is connected between the bit line BL<2> and the common bit line CBL and controlled by a column select signal YSW<2> supplied to the gate electrode of the isolation switch 61<2>. Likewise, the isolation switch 61<3> is connected between the bit line BL<3> and the common bit line CBL and controlled by a column select signal YSW<3> supplied to the gate electrode of the isolation switch 61<3>.

On the other hand, the discharge switch section 6C is a collection of four NMOS switches for electrically discharging electric charge from four bit lines BL<3:0> respectively. In the following description, the four NMOS switches are referred to as discharge switches 62<3:0>.

In accordance with control based on inverted column select signals/YSW<3:0> supplied to the discharge switches 62<3:0> respectively, the discharge switches 62<3:0> carry out operations opposite to the operations performed by the isolation switches 61<3:0> associated with the discharge switches 62<3:0> respectively.

The discharge switch 62<0> is connected between the bit line BL<0> and the ground and controlled by the inverted column select signal/YSW<0> supplied to the gate electrode of the discharge switch 62<0>. By the same token, the discharge switch 62<1> is connected between the bit line BL<1> and the ground and controlled by the inverted column select signal/YSW<1> supplied the gate electrode of to the discharge switch 62<1>. In the same way, the discharge switch 62<2> is connected between the bit line BL<2> and the ground and controlled by the inverted column select signal/YSW<2> supplied to the gate electrode of the discharge switch 62<2>. Likewise, the discharge switch 62<3> is connected between the bit line BL<3> and the ground and controlled by the inverted column select signal/YSW<3> supplied to the gate electrode of the discharge switch 62<3>.

It is to be noted that portions of the fifth to (M-1)th bit lines BL not shown in FIGS. 4 and 5 have array configurations identical with the configuration shown in the figures.

The common bit line CBL is connected to a pre-charge transistor 71 which is a PMOS transistor. The pre-charge transistor 71 is typically connected between a line for supplying a power-supply voltage Vdd or another voltage set at a high level and the common bit line CBL used as a typical common line. The pre-charge transistor 71 is controlled by an inverted BL pre-charge signal/BLPRE supplied to the gate electrode of the pre-charge transistor 71.

Each of the bit lines BL<3:0> has the wire capacitance of a wire capacitor connected to the bit line BL as a load capacitor. In FIGS. 4 and 5, the load capacitor connected to the bit line BL is denoted by reference symbol Cbl also used for denoting the wire capacitance of the bit line BL.

In addition, the common bit line CBL also has a wire capacitance and the capacitance of contacts with the isolation switches 61<3:0>. This wire capacitance and the capacitance of contacts are the capacitance of a wire/contact capacitor connected to the common bit line CBL as a load capacitor. In FIGS. 4 and 5, the load capacitor connected to the common bit line CBL is denoted by reference symbol Ccbl also used for denoting the wire and contact capacitance of the common bit line CBL.

As described above, the connections between the bit lines BL<3:0> and the common bit line CBL or the ground line are implemented by the column switch circuit 6. Thus, a desired read voltage VR can be set without making use of an analog circuit as a voltage generation circuit. As will be described later in detail, the setting of the read voltage VR can be accomplished by making use of the pre-charge transistor 71 to redistribute electric charge electrically pre-charged on the common bit line CBL and any arbitrary number of bit lines BL to any arbitrary number of other bit lines BL.

The row driving circuit 4 has the function of a main decoder. The row driving circuit 4 is configured to include an X selector 20 and a Y selector 30 in order to carry out this function.

The row driving circuit 4 also has the function of a control circuit of a CSW (column switch) circuit 6. The row driving circuit 4 is configured to include a plurality of CSW driver units 6A in order to carry out this function.

In addition, the row driving circuit 4 also has the function of a WL driver. The row driving circuit 4 is configured to include as many WL driver units 4A as the word lines WL to carry out this function. As described earlier, the number of word lines is N.

Typical concrete circuits of the X selector 20, the Y selector 30, the CSW driver unit 6A and the WL driver unit 4A will be described later.

As explained above, the pre-decoder 3 is a circuit for splitting an input address signal into an X address signal (X0, X1 and so on) and a Y address signal (Y0, Y1 and so on).

The X address signal (X0, X1 and so on) is supplied to the X selector 20 employed in the row driving circuit 4. The X selector 20 decodes the X address signal. As a decoding result, the X selector 20 generates X select signals X_SEL <0> to <N-1> used for selecting a WL driver unit 4A. That is to say, the X select signals X_SEL <0> to <N-1> are supplied to the N WL driver units 4A respectively.

On the other hand, the Y address signal (Y0, Y1 and so on) is supplied to the Y selector 30 employed in the row driving circuit 4. The Y selector 30 decodes the Y address signal. As a decoding result, the Y selector 30 generates a Y select signal Y_SEL used for selecting a CSW driver unit 6A. The number of Y select signals Y_SEL varies in accordance with the configuration of the column switch circuit 6 employed in the variable-resistance memory device shown in FIG. 4. Thus, the number of CSW driver units 6A for driving the column switch circuit 6 on the basis of the Y select signal Y_SEL also varies in accordance with the configuration of the column switch circuit 6.

When a WL driver unit 4A is selected by an X select signal X_SEL, the WL driver unit 4A applies a voltage determined in advance to a word line WL connected to the output of the WL driver unit 4A. Details of the WL driver unit 4A will be described later.

The erase driver 10 is a circuit for outputting a voltage to the common bit line CBL and a common source line shown in none of the figures. The direction of the voltage output in a write operation or a set operation in the case of this embodiment is opposite to direction of the voltage output in an erase operation or a reset operation in the case of this embodiment.

In the control of the write and erase operations, in particular, the common-line isolation switch section 6B employed in the column switch circuit 6 works, making it possible to arbitrarily select memory-cell columns each serving as an object of the write or erase operation.

It is to be noted that, in order to control connections between the common source line shown in none of the figures and a column of memory cells MC, a circuit identical with the common-line isolation switch section 6B can be provided between the common source line and the source lines SL. In the four memory cells MC provided on every matrix row of the memory-cell array shown in FIGS. 4 and 5, a write operation is carried out for every memory cell MC. However, an erase operation can be carried out for every matrix row or for all memory cells MC all together. If the erase operation is carried out for every matrix row or for all memory cells MC all together, the circuit identical with the common-line isolation switch section 6B is not absolutely required on the source-line side.

The control circuit 11 receives a write signal WRT, an erase signal ERS as well as a data read signal RD and, on the basis of the write signal WRT, the erase signal ERS as well as the data read signal RD, the control circuit 11 generates a variety of signals and a variety of voltages. The control circuit 11 has the following five functions.

(1) At a read time, the control circuit 11 generates an SA enable signal SAEN or an SA disable signal/SAEN, a bit-line isolation signal BLI and a reference electric potential VREF, outputting the SA enable signal SAEN or the SA disable signal/SAEN, the bit-line isolation signal BLI and the reference electric potential VREF to the SA (sense amplifier) 7. It is to be noted that, in place of the control circuit 11, a voltage generation circuit shown in none of the figures may supply the reference electric potential VREF to the SA (sense amplifier) 7.

(2) At a read time, the control circuit 11 outputs an inverted BL pre-charge signal/BLPRE to the pre-charge transistor 71 and the SA (sense amplifier) 7.

(3) At a write or erase time, the control circuit 11 controls the write/erase driver 10.

(4) At a write or erase time and a read time, the control circuit 11 carries out overall control on the row driving circuit 4 and the column switch circuit 6. It is to be noted that the control carried out at the read time will be described later in particular.

(5) If necessary, the control circuit 11 controls the logic block 16 in order to control data input/output operations and data buffering.

An I/O buffer 9 is connected to the SA (sense amplifier) 7 and the write/erase driver 10.

The logic block 16 carries out control in order to input data coming from an external source and, if necessary, buffer the data in the I/O buffer 9. The buffered data is later supplied to the write/erase driver 10 with a timing determined in advance to be used for controlling a write or erase operation.

In addition, the logic block 16 carries out control in order to output data read out by the SA (sense amplifier) 7 through the write/erase driver 10 to an external data recipient by way of the I/O buffer 9.

Control-System Circuit

Next, the following description explains typical circuits of the X selector 20, the Y selector 30, the WL driver unit 4A and the CSW driver unit 6A.

Figure 6:
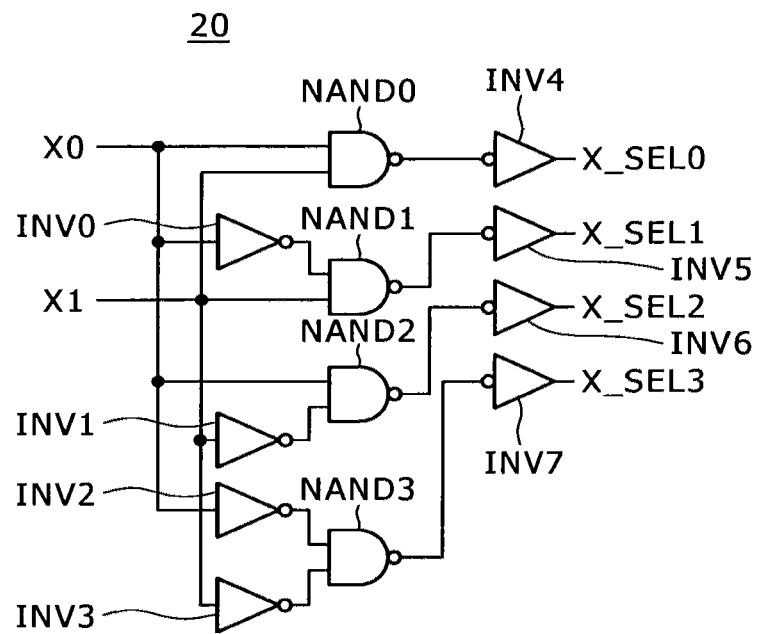
FIG. 6 is a diagram showing a logic circuit of an X selector.

FIG. 6 is a diagram showing a typical logic circuit of the X selector 20.

As shown in FIG. 6, the X selector 20 employs four inverters INV0 to INV3 provided at the front stage, four NAND circuits NAND0 to NAND3 provided at the middle stage and four other inverters INV4 to INV7 provided at the rear stage.

The X selector 20 receives X-address signal bits X0 and X1, decoding the X-address signal bits X0 and X1. As a result of the decoding, the X selector 20 activates one of four X select signals X_SEL0 to X_SEL3 by typically raising one of the four X select signals X_SEL0 to X_SEL3 to a high level.

FIG. 6 shows the configuration of a typical 2-bit decoder. In accordance with the number of X-address signal bits, however, the configuration shown in FIG. 6 can be extended to a multi-bit configuration allowing more bits of the X-address signal to be supplied to the decoder. That is to say, it is possible to adopt a configuration for decoding more than two X-address signal bits.

Figure 7:
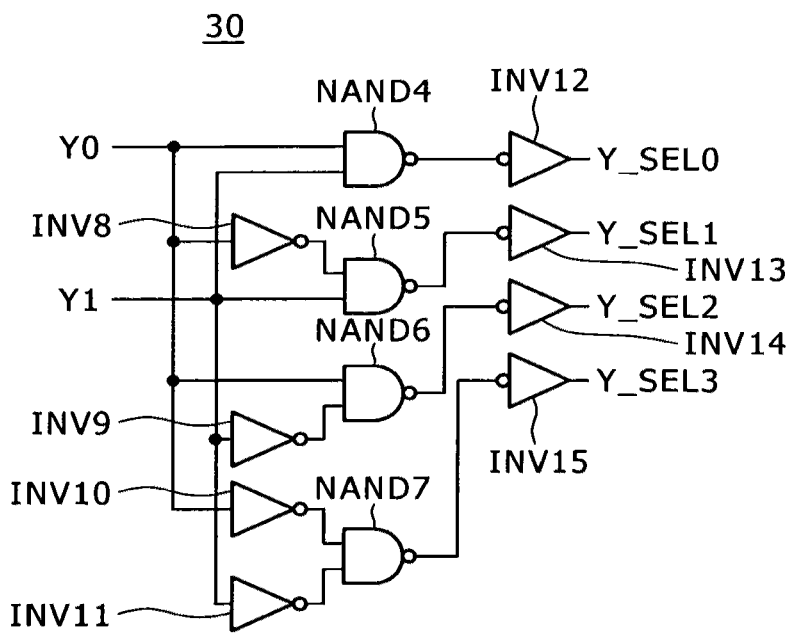
FIG. 7 is a diagram showing a logic circuit of a Y selector.

FIG. 7 is a diagram showing a typical logic circuit of the Y selector 30.

As shown in FIG. 7, the Y selector 30 employs four inverters INV8 to INV11 provided at the front stage, four NAND circuits NAND4 to NAND7 provided at the middle stage and four other inverters INV12 to INV15 provided at the rear stage.

The Y selector 30 receives Y-address signal bits Y0 and Y1, decoding the Y-address signal bits Y0 and Y1. As a result of the decoding, the Y selector 30 activates one of four Y select signals Y_SEL0 to Y_SEL3 by typically raising one of the four Y select signals Y_SEL0 to Y_SEL3 to a high level.

FIG. 7 shows the configuration of a typical 2-bit decoder. In accordance with the number of Y-address signal bits, however, the configuration shown in FIG. 7 can be extended to a multi-bit configuration allowing more bits of the Y-address signal to be supplied to the decoder. That is to say, it is possible to adopt a configuration for decoding more than two Y-address signal bits.

Figure 8:
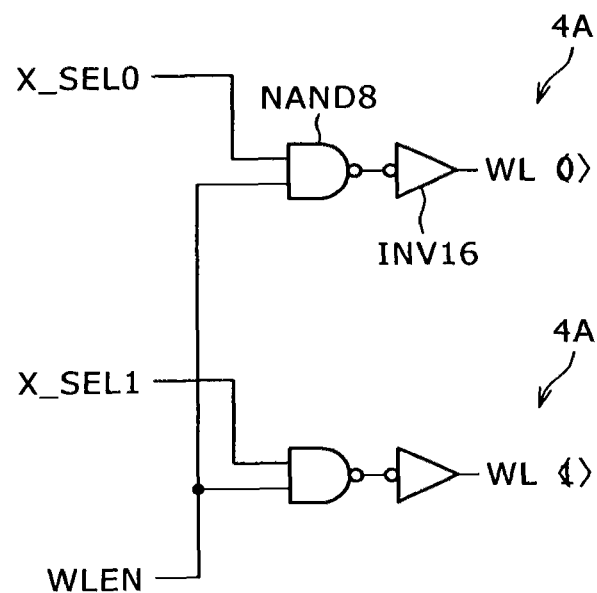
FIG. 8 is a diagram showing a logic circuit of a WL driver unit.

FIG. 8 is a diagram showing a typical logic circuit of two adjacent WL driver units 4A.

The row driving circuit 4 actually includes (N-1) WL driver units 4A two of which are shown in the FIG. The number (N-1) is the number of memory cells laid out in the column direction on every column. One of the (N-1) WL driver units. 4A is selected to operate by the X select signal X_SEL0 or X_SEL1 activated by the X selector 20 shown in FIG. 6. Then, the selected WL driver unit 4A activates the word line WL <0> or the word line WL <1> corresponding to the X select signal X_SEL0 or the X select signal X_SEL1 respectively.

As shown in FIG. 8, each WL driver unit 4A employs a NAND circuit (for example, NAND8) and an inverter (for example, INV16).

One of the two inputs of the NAND circuit NAND8 receives a WL select enable signal WLEN whereas the other input receives the X select signal X_SEL0 or X_SEL1 activated by the X selector 20 shown in FIG. 6. The output of the NAND circuit NAND8 is connected to the input of the inverter INV16. Thus, the word line WL<0> or WL<1> connected to the output of the inverter INV16 is activated or deactivated.

Figure 9:
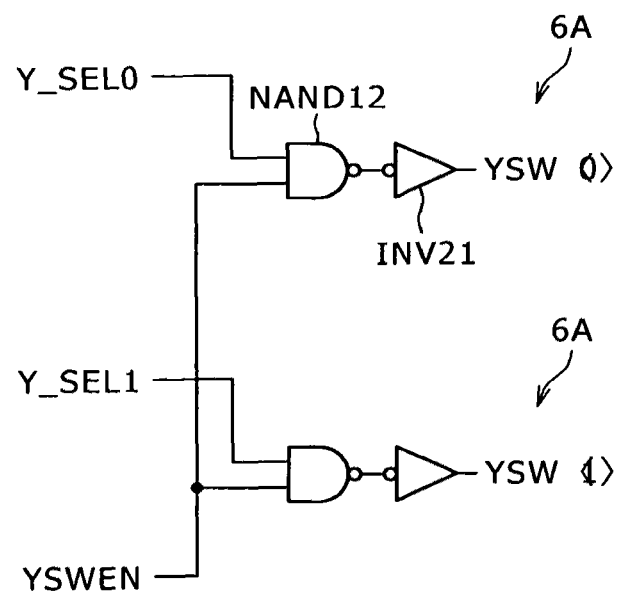
FIG. 9 is a diagram showing a logic circuit of a CSW driver unit.

FIG. 9 is a diagram showing a typical logic circuit of two adjacent CSW driver units 6A.

As shown in FIG. 9, each CSW driver unit 6A employs a NAND circuit (for example, NAND12) and an inverter (for example, INV21).

One of the two inputs of the NAND circuit NAND12 receives a Y switch enable signal YSWEN whereas the other input receives the Y select signal Y_SEL0 or Y_SEL1 activated by the Y selector 30 shown in FIG. 7.

When the Y select signal Y_SEL0 or Y_SEL1 and the Y switch enable signal YSWEN are both set at a high level of a state of being activated, the signal output by the NAND circuit NAND12 is brought down to a low level. Thus, the column select signal YSW<0> or YSW<1> output by an inverter INV21 connected to the output of the NAND circuit NAND12 makes a transition to an activated level which is the high level in the case of the first embodiment.

Sense Amplifiers

Figure 10:
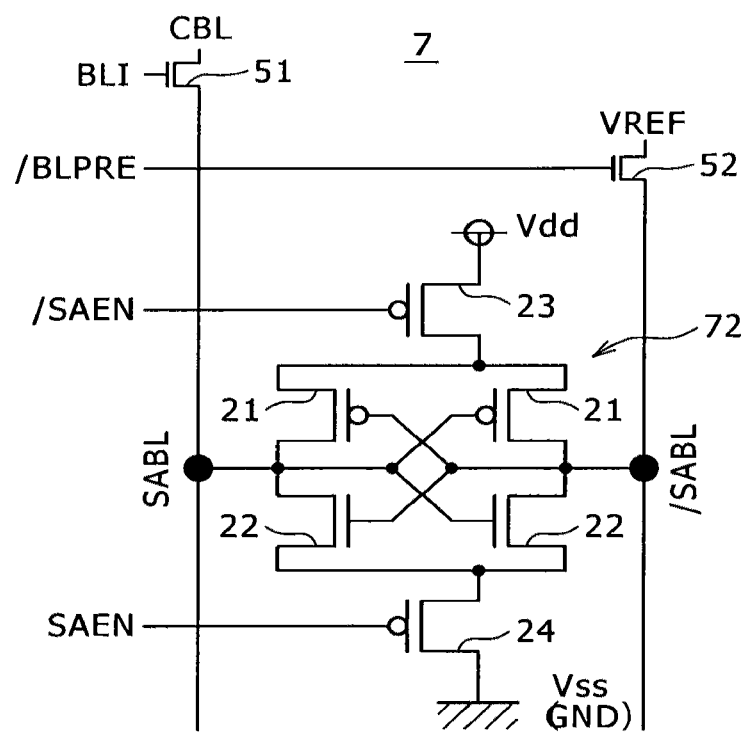
FIG. 10 is a circuit diagram showing a sense amplifier of a single-end type.

FIG. 10 is a diagram showing a typical configuration of an SA (sense amplifier) 7 shown in FIGS. 4 and 5.

The SA (sense amplifier) 7 shown in FIG. 10 is a sense amplifier of the single-end type. The basic configuration of the SA (sense amplifier) 7 includes a latch circuit 72 for sensing the electric potential appearing on a sense bit line SABL as a voltage and amplifying this sensed voltage with the electric potential of a sense bit reference line/SABL taken as a reference.

The latch circuit 72 according to this embodiment employs two inverters which are cross-connected to each other. To put it in detail, the output of a specific one of the inverters is connected to the input of the other inverter whereas the output of the other inverter is connected to the input of the specific inverter. Each of the inverters has a PMOS transistor 21 and an NMOS transistor 22.

A PMOS transistor 23 is connected between the common source electrodes shared by the two PMOS transistors 21 and a line used for supplying a power-supply voltage Vdd. The PMOS transistor 23 is controlled by an inverted SA enable signal/SAEN supplied to the gate electrode of the PMOS transistor 23. The inverted SA enable signal/SAEN is a low-active signal. On the other hand, a NMOS transistor 24 is connected between the common source electrodes shared by the two NMOS transistors 22 and a line used for supplying the GND (ground) voltage. The NMOS transistor 24 is controlled by an SA enable signal SAEN supplied to the gate electrode of the NMOS transistor 24. The SA enable signal SAEN is a high-active signal which is obtained by inverting the inverted SA enable signal/SAEN. The SA enable signal SAEN and the inverted SA enable signal/SAEN are received from the control circuit 11 employed in the variable-resistance memory device shown in FIG. 4.

It is to be noted that the inverted SA enable signal/SAEN can also be generated internally in the SA (sense amplifier) 7 by inverting the SA enable signal SAEN by making use of an inverter.

In addition, an NMOS transistor 51 serving as a bit-line isolation switch is connected between the sense bit line SABL and the common bit line CBL.

On top of that, an NMOS transistor 52 for controlling the application of the reference electric potential VREF cited above to the latch circuit 72 is connected between the sense bit reference line/SABL and a line used for supplying the reference electric potential VREF. The NMOS transistor 52 is controlled by an inverted BL pre-charge signal/BLPRE/supplied to the gate electrode of the NMOS transistor 52. The inverted BL pre-charge signal/BLPRE is received from the control circuit 11 employed in the variable-resistance memory device shown in FIG. 4.

With the above configuration given as a premise, two typical operations are explained by making use of waveforms shown in FIGS. 11A and 12F and by properly referring to FIGS. 5 and 10 as follows.

It is to be noted that, as a premise, after a write or erase operation, a read-to-verify operation is carried out in the case of this embodiment and all the typical operations described below. However, the scope of the present disclosure is by no means limited to this scheme. That is to say, the present disclosure can also be applied to a normal read operation.

In addition, in all the typical operations described below, the pre-charge voltage is set at the power-supply voltage Vdd whereas the post-discharge voltage is set at the reference voltage Vss which is typically the GND (ground) voltage. However, the present disclosure is by no means limited to this voltage setting. That is to say, each of the pre-charge voltage and the post-discharge voltage can be set at any level as long as the pre-charge voltage is higher than the post-discharge voltage.

First Typical Operations

In first typical operations represented by waveforms shown in FIGS. 11A to 11E, electric charge is electrically pre-charged to the bit line BL<0> selected by a column select signal YSW<0> toward the power-supply voltage Vdd and, later on, the electric charge is electrically discharged to other bit lines BL<1> to BL<3> in order to share the electric charge among the bit lines BL<0> to BL<3> in an electrical-charge sharing operation.

First of all, the column select signal YSW<0> is activated by raising the column select signal YSW<0> to an H level as is obvious from a waveform shown in FIG. 11B whereas the other column select signals YSW<1> to YSW<3> are deactivated by lowering the other column select signals YSW<1> to YSW<3> to an L level as is obvious from a waveform shown in FIG. 11C. As shown in FIG. 11C, the other column select signals YSW<1> to YSW<3> are denoted by reference symbol YSW<3:1>.

In this state, during a period prior to a time T1 on a waveform shown in FIG. 11A, the inverted BL pre-charge signal/

BLPRE supplied to the gate electrode of the pre-charge transistor 71 employed in the memory-cell array 1 shown in FIG. 5 is set at the L level.

Thus, the pre-charge transistor 71 is put in a state of being turned on, electrically pre-charging the common bit line CBL to the power-supply voltage Vdd. At that time, the bit line BL<0> selected by the activated column select signal YSW<0> and connected by the activated column select signal YSW<0> to the common bit line CBL is also electrically pre-charged to the power-supply voltage Vdd.

During this pre-charge period, only the inverted column select signal /YSW<0> is put at the L level. Thus, the discharge switch 62<0> employed in the memory-cell array 1 shown in FIG. 5 is put in a state of being turned off whereas the other discharge switches 62<1> to 62<3> are each put in a state of being turned on. Thus, the electric potential appearing on each of the other bit lines BL<1> to BL<3> is set at the level of the reference voltage Vss which is typically the GND (ground) voltage. The discharged state of each of the other bit lines BL<1> to BL<3> is referred to as a BL-reset state.

Then, at the time T1 on the waveform shown in FIG. 11A, the pre-charge transistor 71 is turned off in order to terminate the pre-charging operation. Thus, the electric potentials appearing on the common bit line CBL and the bit line BL<0> are put in a state of being floated. As a result, a state of dynamically holding the power-supply voltage Vdd is started.

Then, at a time T2 on the waveform shown in FIG. 11C, the state of connecting the bit lines BL<1> to BL<3> of the memory-cell array 1 shown in FIG. 5 to the reference voltage Vss is terminated and all the other column select signals YSW<3:1> are selected, being set at the H level representing an active state. Thus, all the other discharge switches 62<3:0> of the memory-cell array 1 shown in FIG. 5 are put in a state of being turned off whereas all the other isolation switches 61<3:0> of the memory-cell array 1 shown in FIG. 5 are put in a state of being turned on.

In this state, the electric charge electrically pre-charged on the common bit line CBL and the bit line BL<0> is electrically discharged to the bit lines BL<1> to BL<3> in order to share the electric charge among the bit lines BL<0> to BL<3> in an electrical-charge sharing operation.

The voltage appearing on the bit line BL<0> after the electrical-charge sharing operation has been completed is about ¼ of the voltage appearing on the bit line BL<0> at the pre-charge time. That is to say, the voltage appearing on the bit line BL<0> after the electrical-charge sharing operation has been completed attenuates to Vdd/4. In this way, a read voltage VR of Vdd/4 is set uniformly on the four bit lines BL<0> to BL<3>.

The read voltage VR obtained after the voltage attenuation is expressed by Eq. (1) given as follows:

$$VR = Vdd \times (Cbl \times Nsel)/(Ccbl + Cbl \times (Nsel + Nvss)) \quad (1)$$

In Eq. (1) given above, reference symbol Ccbl denotes the capacitance of the common bit line CBL whereas reference symbol Cbl denotes the capacitance of every bit line BL. Reference symbol Nsel denotes the number of specific bit lines BL sharing electric charge to be electrically discharged to other bit lines BL after electrically pre-charging the electric charge to the specific bit lines BL toward the power-supply voltage Vdd. Reference symbol Nvss denotes the number of aforementioned other bit lines BL each serving as an object of electrical-charge sharing after electric charge of each of these other bit lines BL has been reset in an electrical discharge process to the reference voltage Vss.

As is obvious from a waveform shown in FIG. 11E, due to the electrical discharge process, the electric potential appearing on the bit line BL<0> decreases whereas, due to the electrical charge process, the electric potentials appearing on the other bit lines BL<1> to BL<3> denoted by reference symbol BL<3:1> increase. It is also obvious that the electric potential appearing on the bit line BL<0> and the electric potentials appearing on the other bit lines BL<1> to BL<3> converge to the read voltage VR.

Later on, at a time T3 on the waveform shown in FIG. 11C, the electric potentials appearing on the column select signals YSW<3:1> decrease whereas the electric potential appearing on the word line WL<0> increases.

As a result, the electric charge of the bit line BL<0> electrically charged to the read voltage VR is electrically discharged to the source line SL<0> through the memory cell MC.

In the waveform shown in FIG. 11E, reference symbol LRS denotes a low-resistance state of the variable-resistance storage element Re whereas reference symbol HRS denotes a high-resistance state of the variable-resistance storage element Re.

In the HRS, the magnitude of a current flowing through the variable-resistance storage element Re employed in the memory cell MC is not so large. In the LRS, on the other hand, a large current flows through the variable-resistance storage element Re employed in the memory cell MC. Thus, in this case, the electric potential appearing on the bit line BL decreases by an electric-potential difference during the electrical discharge process.

With a timing resulting in a sufficient electric-potential difference, the SA (sense amplifier) 7 shown in FIG. 10 carries out a voltage sensing operation.

To put it concretely, the NMOS transistor 52 employed in the SA (sense amplifier) 7 shown in FIG. 10 is in a state of being turned on during a read period after the time T1 on the waveform shown in FIG. 11A whereas the reference electric potential VREF has been set on the reference node of the latch circuit 72. The SA enable signal SAEN or the inverted SA enable signal /SAEN is put in an active state in order to activate the SA (sense amplifier) 7. In this state, if the bit-line isolation signal BLI not shown in FIGS. 11A to 11E is set at a high level, the decrease of the voltage appearing on the bit line BL<0> is propagated to the sensing node of the SA (sense amplifier) 7.

This timing is a timing for which the decreased voltage in the LRS becomes sufficiently lower than the reference electric potential VREF by a sustained margin. The reference electric potential VREF is set at a middle electric potential between an eventual level to which the voltage decreases in the LRS and an eventual level to which the voltage decreases in the HRS or set at a level higher than the middle electric potential by a difference deemed as necessary if shortening of the sensing period is to be taken into consideration.

In the first typical operations described above, electric charge is electrically pre-charged to the bit line BL<0> and the electrically pre-charged electric charge is electrically discharged to three other bit lines BL<3:1> in an electrical-charge sharing operation. In place of the bit line BL<0>, electric charge can also be electrically pre-charged to any one of the bit lines BL<0>, BL<1>, BL<2> and BL<3> and the electrically pre-charged electric charge is then electrically discharged to the three remaining bit lines BL.

In addition, electric charge can also be electrically pre-charged to any two of the bit lines BL<0>, BL<1>, BL<2> and BL<3> and the electrically pre-charged electric charge is then electrically discharged to the two remaining bit lines BL.

On top of that, electric charge can also be electrically pre-charged to any three of the bit lines BL<0>, BL<1>, BL<2> and BL<3> and the electrically pre-charged electric charge is then electrically discharged to the remaining bit line BL.

Second Typical Operations

In the case of the first typical operations, the electric potential appearing on any bit line BL other than the electrically pre-charged bit line BL can be taken as a read object.

In the case of second typical operations described below, on the other hand, the bit line BL<0> is electrically pre-charged whereas the electric potential appearing on the bit line BL<1> is read out.

Figures 12A, 12B, 12C, 12D, 12E, 12F:
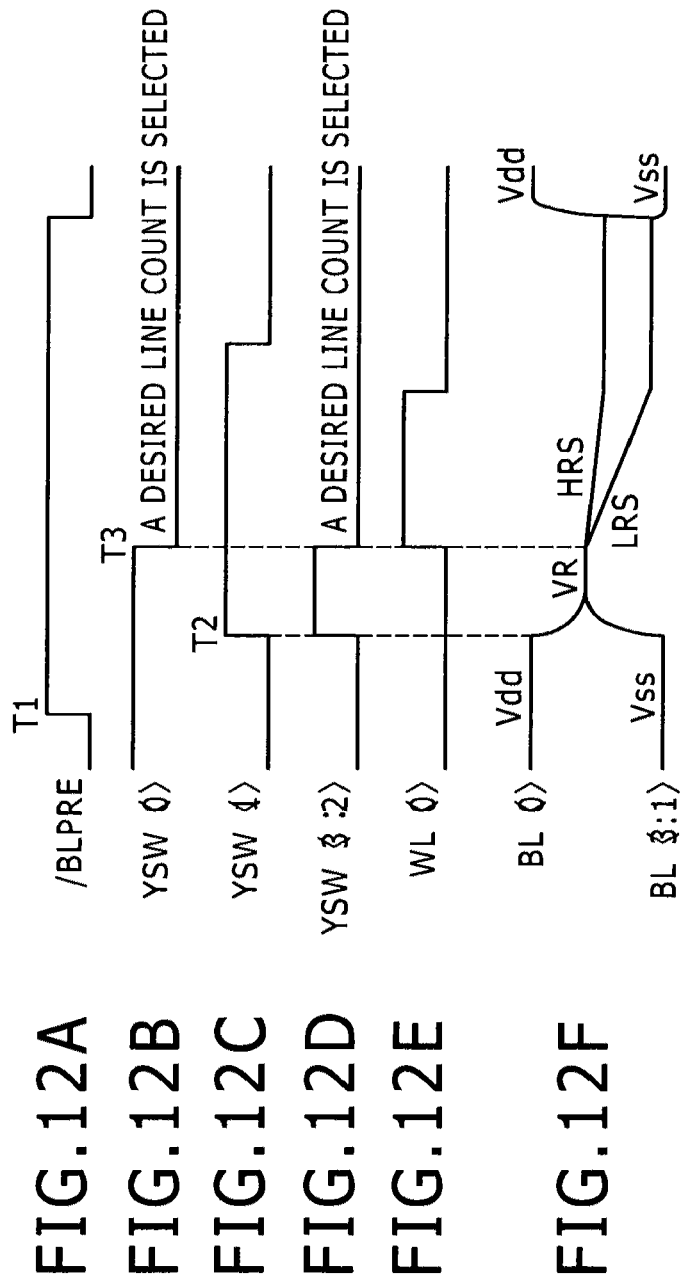
FIGS. 12A to 12F are timing diagrams showing waveforms for second typical operations.

In FIGS. 12A to 12F, the waveform shown in FIG. 11C for the column select signals YSW<3:1> is split into two waveforms, i.e., a waveform shown as a waveform shown in FIG. 12C for the column select signal YSW<1> and another waveform shown in FIG. 12D for the column select signals YSW<3:2>. Thus, the second typical operations are different from the first typical operations. In addition, the timing of the falling edge of the waveform shown in FIG. 12B for the column select signal YSW<0> is changed from that of FIG. 11B.

To put it concretely, the electric potential of the column select signal YSW<0> shown in FIG. 12B is lowered at a time T3 in order to thereafter establish a state of being deselected in which the bit line BL<0> is detached from the common bit line CBL.

Instead, since the electric potential appearing on the bit line BL<1> is to be taken as a read object as described above, the electric potential appearing on the column select signal YSW<1> shown in FIG. 12C is sustained at the H level of the state of being activated during a period after the time T3. As is obvious from the waveform shown in FIG. 12C, the electric potential appearing on the column select signal YSW<1> shown in FIG. 12C has been raised to the H level at a time T2. In this way, the electric potential appearing on the bit line BL<1> can be taken as a read object.

At the time T3, the bit lines BL<2> and BL<3> are detached from the common bit line CBL in the same way as the first typical operations. For the sake of clarity in this case, the reader is requested to compare the waveform shown in FIG. 11C with the waveform shown in FIG. 12D.

In addition, the control of the other signals and the sensing operation are basically the same as those of the first typical operations.

Third Typical Operations

FIGS. 13A to 13G are timing diagrams showing waveforms for third typical operations carried out to electrically pre-charge electric charge to any two of the bit lines BL<0>, BL<1>, BL<2> and BL<3> and then electrically discharge the electrically pre-charged electric charge to the two remaining bit lines BL.

FIGS. 13A to 13G are different from FIGS. 11A to 11E in that, in the case of FIGS. 13A to 13G, at a time T1 coinciding with the start of the pre-charge operation, the column select signal YSW<1> has been set at the H level in advance in addition to the column select signal YSW<0> so as to electrically pre-charge electric charge to two bit lines BL, i.e., the bit line BL<1> in addition to the bit line BL<0> to the power-supply voltage Vdd.

Then, at a time T2, the electrically pre-charged electric charge is shared with the two other bit lines BL<2> and BL<3> so as to set the read voltage VR at about ½ of the power-supply voltage Vdd.

Later on, at a time T3, in order to remove the bit line BL<1> from a group of read objects, the electric potential appearing on the column select signal YSW<1> is lowered. At the same time, the electric potential appearing on the word line WL<0> is raised in order to electrically discharge the cell current flowing at a read time.

The control of the other signals and the sensing operation are basically the same as those of the first typical operations.

Fourth Typical Operations

In the first to third typical operations described so far, the number of bit lines BL sharing electric charge is four but the number of bit lines BL sharing electric charge can be reduced to two or three.

As an example, FIGS. 14A to 14G show waveforms for operations to share electric charge electrically pre-charged to one bit line BL by two bit lines BL.

FIGS. 14A to 14G are different from FIGS. 11A to 11E in that, in the case of FIGS. 14A to 14G, the column select signals YSW<0> and YSW<3> are neither a pre-charge object nor a read object. Thus, during a read operation, the column select signals YSW<0> and YSW<3> are sustained at the L level as is obvious from the waveforms shown in FIGS. 14C and 14D.

Accordingly, electric charge electrically pre-charged to the bit line BL<0> at a time T1 is shared by the bit line BL<2> at a time T2 and, at a time T3, the bit line BL<2> is deselected so that a change of the electric potential appearing on the bit line BL<0> is read out.

The typical operations described above are merely a portion of typical operations carried out in accordance with the first embodiment.

Even in operations other than the first to fourth typical operations described above, if two bit lines BL or three bit lines BL have been electrically pre-charged, an operation to switch the bit line BL among the electrically pre-charged bit lines BL or an operation to change a bit line BL serving as a read object to a bit line BL which is not electrically pre-charged in advance but will share electrically pre-charged electric charge is easy to infer from an operation to switch the bit line BL from a state of being selected to a state of being deselected and vice versa.

In addition, the number of bit lines BL to share electrically pre-charged electric charge is not limited to two for the case shown in FIGS. 13A to 13G. For example, the number of bit lines BL to share electrically pre-charged electric charge can also be three.

The number of bit lines BL to be electrically pre-charged and the number of bit lines BL to share electrically pre-charged electric charge are determined on the basis of the magnitude of a voltage at which the read voltage VR is to be set.

The operations according to this embodiment are characterized in that the process of generating the read voltage VR is carried out by dividing wire capacitances. Thus, an analog voltage is not required at all in the process of generating the read voltage VR.

That is to say, in the process of generating the read voltage VR, a circuit requiring a DC standby current does not exist. Thus, the non existence of such a circuit allows a read operation to be carried out at a small power consumption.

The waveform diagrams of FIGS. 11A to 14G do not show the waveforms of signals used for controlling the SA (sense amplifier) 7.

FIGS. 15A to 15E are diagrams showing waveforms for a read-to-verify operation for a case in which the variable-resistance storage element Re is in the LRS whereas FIGS. 16A to 16E are diagrams showing waveforms for a read-to-verify operation for a case in which the variable-resistance storage element Re is in the HRS. The SA (sense amplifier) 7 used for carrying out the read-to-verify operation has a configuration already explained by referring to FIG. 10.

When the electric potential appearing on the word line WL connected to a memory cell MC serving as a read object rises at a time T3, a process of electrically discharging the electric potential of the bit line BL by letting a cell current flow through the memory cell MC is started.

In the case of the LRS shown in FIGS. 15A to 15E, the speed of the electrical discharge process is high. In a period starting at a time T34, the electric potential appearing on the sense bit line (or the common bit line CBL) becomes a level not higher than the reference electric potential VREF. A time T4 is a time after a time margin has lapsed since the time T34. At the time T4, the bit-line isolation signal BLI is turned off and the SA enable signal SAEN is set at a H level in order to activate the SA (sense amplifier) 7 shown in FIG. 10.

An electric potential appearing on the sensing node is supplied to an external bus as output data by way of the I/O buffer 9 employed in the variable-resistance memory device shown in FIG. 4.

In the case of the HRS shown in FIGS. 16A to 16E, even at the time T4, the sensing node on the CBL side is sustained in a state of being higher than the reference electric potential VREF as it is. Thus, the logic of the output data supplied to the external bus is the inverse of the logic for the LRS case.

The SA (sense amplifier) 7 shown in FIG. 10 is a single-end sense amplifier of the cross latch type. The SA (sense amplifier) 7 is activated only during a period in which the SA (sense amplifier) 7 needs to be activated.

A sense amplifier employing components such as an operational amplifier needs to be put in a state of being activated all the time. Unlike the sense amplifier employing components such as an operational amplifier, however, the configuration of the SA (sense amplifier) 7 and a system adopted thereby are so designed that the sense-amplifier operation itself requires almost no DC current.

In accordance with the first embodiment described above, in an operation to generate the read voltage VR, an analog circuit consuming large power is not required. A process of electrically pre-charging a bit line BL can be accomplished by merely changing the state of a switch so as to allow the read voltage VR to be set on a desired bit line BL. Thus, the power consumption can be reduced.

In addition, the wire-capacitance ratio determining the read voltage VR is determined by attributes of wires created as a job lot in a semiconductor process. In this case, the attributes include the thickness, the depth and the material. Thus, the wire-capacitance ratio can be prescribed with a relatively high degree of precision. On top of that, even if there are variations of a voltage representing the amount of electric charge electrically pre-charged to one or more bit lines BL, the electric charge is later shared with other bit lines BL. Thus, when the read voltage VR is generated, an error component of the voltage representing the amount of electric charge electrically pre-charged to one or more bit lines BL is attenuated to a fraction. As a result, the read voltage VR can be set with a relatively high degree of precision.

It is to be noted that, in the configuration of the SA (sense amplifier) 7 shown in FIG. 10, during a process of amplifying or sensing the voltage appearing on the bit line BL, in order to avoid a disturbance caused by the amplitude of the voltage appearing on the bit line BL, voltage control making use of the bit-line isolation signal BLI isolates the common bit line CBL and a load on the bit-line side from the sensing node of the SA (sense amplifier) 7 in an amplification operation. It is thus possible to avoid such a disturbance and, hence, carry out a sensing operation at a high speed.

2: Second Embodiment

Figure 17:
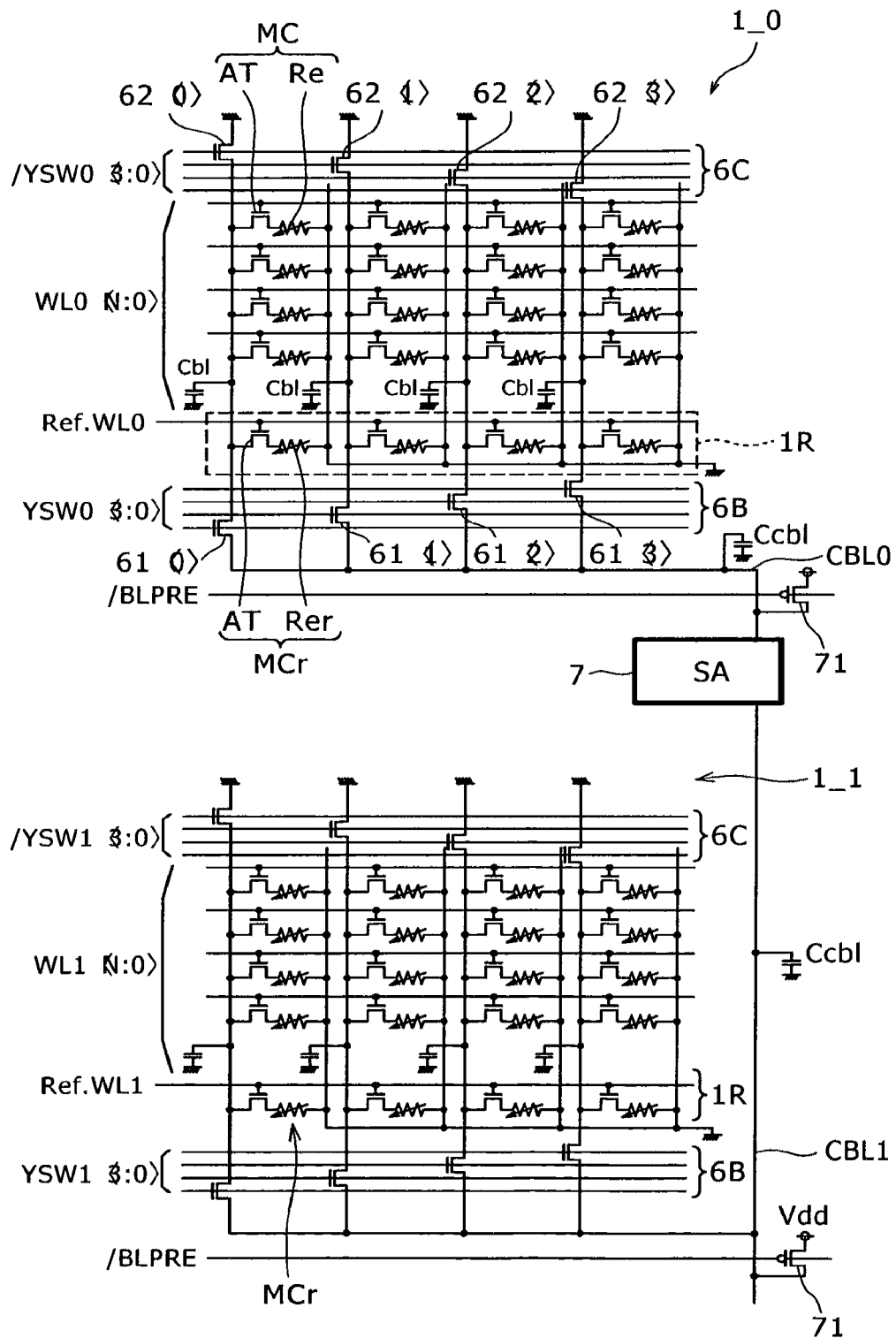
FIG. 17 is an enlarged diagram showing a memory-cell array according to a second embodiment.

FIG. 17 is an enlarged diagram showing the configuration of a memory-cell array according to a second embodiment as well as connections between memory blocks 1_0 and 1_1 of the memory-cell array and an SA (sense amplifier) 7.

The configuration of a memory-cell array according to the second embodiment is divided into the two memory blocks 1_0 and 1_1 which each have a storage capacity corresponding to that of the memory-cell array 1 shown in FIG. 5. The two memory blocks 1_0 and 1_1 are connected to one SA (sense amplifier) 7.

Each of the memory blocks 1_0 and 1_1 employs memory cells MC arranged to form a matrix consisting of N rows and four columns. The storage capacity of each of the memory blocks 1_0 and 1_1 is the same as that of the memory-cell array 1 shown in FIG. 5.

However, each of the memory blocks 1_0 and 1_1 is different from the memory-cell array 1 shown in FIG. 5 in that each of the memory blocks 1_0 and 1_1 includes at least one row serving as a reference section 1R having reference memory cells MCr.

In the memory-cell array shown in FIG. 17, each of the memory blocks 1_0 and 1_1 has a common-line isolation switch section 6B and a discharge switch 6C which each have a configuration already explained earlier. In the memory block 1_0, the SA (sense amplifier) 7 is connected to memory cells MC or reference memory cells MCr through the common-line isolation switch section 6B and a common bit line CBL0. By the same token, in the memory block 1_1, the SA (sense amplifier) 7 is connected to memory cells MC or the reference memory cells MCr through the common-line isolation switch section 6B and a common bit line CBL1.

It is to be noted that, in the connections shown in FIG. 17, the connection between the SA (sense amplifier) 7 and the common bit line CBL0 and the connection between the SA (sense amplifier) 7 and the common bit line CBL1 is not symmetrical with respect to the SA (sense amplifier) 7. Thus, the wire capacitance Ccbl of the common bit line CBL0 may be different from the wire capacitance Ccbl of the common bit line CBL1 in some cases. In order to make the wire capacitance Ccbl of the common bit line CBL0 the same as the wire capacitance Ccbl of the common bit line CBL1, it is necessary to make the memory block 1_0 and the memory block 1_1 symmetrical with respect to the SA (sense amplifier) 7. That is to say, with the SA (sense amplifier) 7 taken as a mirror, it is necessary to lay out the memory block 1_0 and the memory block 1_1 so that the memory block 1_0 becomes an object whereas the memory block 1_1 becomes the mirror image of the memory block 1_0 or vice versa.

In FIG. 17, in order to distinguish column select signals YSW in the memory block 10 and the memory block 1_1 from each other, the number 0 serving as a suffix is appended to reference symbol YSW denoting a column select signal in the case of the memory block 1_0 to form reference symbol YSW0 denoting a column select signal in the memory block 1_0 whereas, in the case of the memory block 1_1, on the other hand, the number 1 serving as a suffix is appended to reference symbol YSW to form reference symbol YSW1 denoting a column select signal in the memory block 1_1.

By the same token, in order to distinguish word lines WL in the memory block 1_0 and the memory block 1_1 from each other, the number 0 serving as a suffix is appended to reference symbol WL denoting a word line in the case of the memory block 1_0 to form reference symbol WL0 denoting a word line in the memory block 1_0 whereas, in the case of the memory block 1_1, on the other hand, the number 1 serving as a suffix is appended to reference symbol WL to form reference symbol WL1 denoting a word line in the memory block 1_1.

It is to be noted that reference symbol Ref.WL denotes a word line for controlling the reference memory cells MCr. In the same way as the column select signals YSW and the word lines WL, in order to distinguish word lines WL for controlling the reference memory cells MCr in the memory block 1_0 and the memory block 1_1 from each other, the number 0 serving as a suffix is appended to reference symbol Ref.WL to form reference symbol Ref.WL0 in the case of the memory block 1_0 whereas the number 1 serving as a suffix is appended to reference symbol Ref.WL to form reference symbol Ref.WL1 in the case of the memory block 1_1.

The latch circuit 72 controlled by the inverted BL pre-charge signal/BLPRE is connected to both the common bit lines CBL0 and CBL1.

Figure 18:
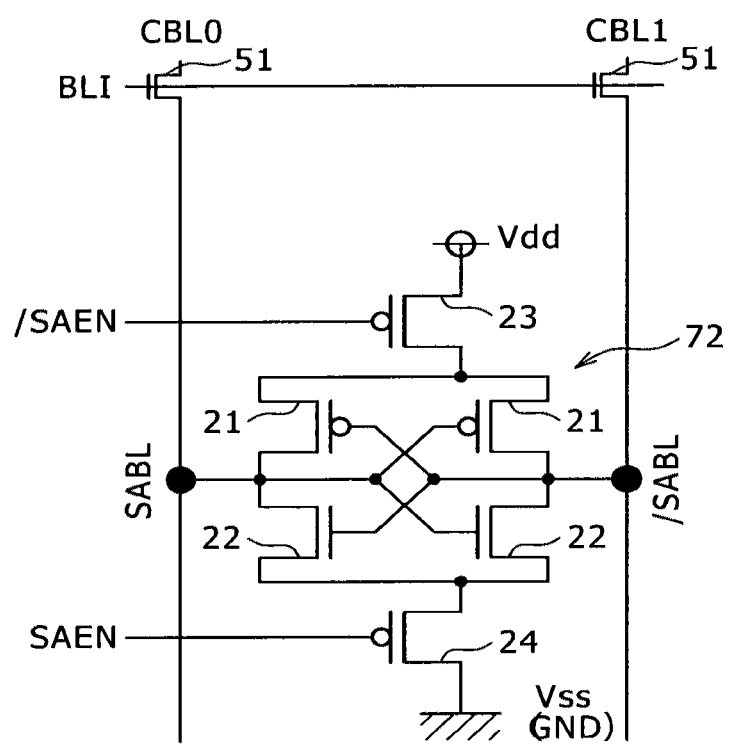
FIG. 18 is a circuit diagram showing a sense amplifier.

FIG. 18 is a diagram showing the circuit of a complementary-signal differential sense amplifier 7 desirably applicable to the configuration shown in FIG. 17.

The SA (sense amplifier) 7 shown in FIG. 18 is different from the SA (sense amplifier) 7 shown in FIG. 10 in that, in the case of the SA (sense amplifier) 7 shown in FIG. 18, the NMOS transistor 52 employed in the SA (sense amplifier) 7 shown in FIG. 10 is eliminated whereas an NMOS transistor 51 is additionally connected between a sense bit reference line/SABL and the common bit line CBL1.

The bit-line isolation signal BLI is used for simultaneously controlling this NMOS transistor 51 connected between an sense bit reference line/SABL and the common bit line CBL1 as well as the NMOS transistor 51 connected between an sense bit line SABL and the common bit line CBL0.

Other configurations of the latch circuit 72 employed in the SA (sense amplifier) 7 shown in FIG. 18 are identical with those of the latch circuit 72 employed in the SA (sense amplifier) 7 shown in FIG. 10.

In the configuration shown in FIG. 18 as described above, when the storage state of a memory cell MC is read out from either the memory block 1_0 or the memory block 1_1, a sensing operation is carried out in a state of connecting the other common bit line to the reference memory cell MCr. At that time, a read operation is carried out also on the reference memory cell MCr. Thus, the reference electric potential dynamically changes. That is to say, the reference electric potential becomes lower. By the storage state of a memory cell, the HRS or the LRS is implied.

The resistance of the variable-resistance storage element Re employed in a reference memory cell MCr is set in advance at a value between the resistance of an MC in the HRS and the resistance of an MC in the LRS. Ideally, the value between the resistance of an MC in the HRS and the resistance of an MC in the LRS is a value in about the middle between the resistance of an MC in the HRS and the resistance of an MC in the LRS.

This sensing method has a merit that, even if the sense amplifier 7 operates at a high speed, there is by no means a malfunction. In general, to a certain degree, there are variations of the characteristic of the memory cell MC and variations of a bias voltage such as the power-supply voltage Vdd used for generating the reference voltage. In accordance with this sensing method, however, the reference electric potential dynamically changes to follow the bit-line electric potential affected by the variations. Thus, the SA (sense amplifier) 7 hardly carries out a malfunction caused by these variations so that it does not take time to confirm logic. Thus, the operation can be carried at a high speed.

It is to be noted that, with regard to determination as to which of the memory blocks 1_0 and 1_1 is to be selected as a read object and which of the memory blocks 1_0 and 1_1 is to be selected as a reference, for example, the pre-decoder 3 employed in the variable-resistance memory device shown in FIG. 4 recognizes predetermined bits of an input address as a block select address. In the row driving circuit 4, the WL driver unit 4A and the CSW driver unit 6A are provided for every memory block. In addition, in the row driving circuit 4, a block selector having a configuration identical with that of the X selector 20 is provided.

The block selector decodes the block select address received from the pre-decoder 3, driving two WL driver units 4A provided for every block to select memory cells MC and the other WL driver unit 4A to select reference memory cells MCr. In addition, the block selector controls two CSW driver units 6A provided for every block so that different column select operations for a block including memory cells MC serving as a read object and a block not including memory cells MC serving as a read object are carried out.

It is to be noted that details of the block selector will be explained later in the description of another embodiment.

FIGS. 19A to 19E are timing diagrams showing waveforms of operations for a case in which memory blocks are subjected to setting of the read voltage VR in a way similar to the first typical operations performed by the first embodiment as explained earlier by referring to FIGS. 11A to 11E. FIGS. 20A to 20D are timing diagrams showing waveforms for a sensing operation in an LRS. FIGS. 21A to 21D are timing diagrams showing waveforms for a sensing operation in an HRS.

At a time T1 shown in FIGS. 19A to 19E, an electrical pre-charging operation is started. At the time T1, the column select signals YSW0<0> and YSW1<0> have been set in advance at the H level so that, in both the memory blocks 1_0 and 1_1, the bit line BL<0> is electrically pre-charged to the power-supply voltage Vdd.

A total of six other bit lines BL0<3:1> and BL1<3:1> of the memory blocks 1_0 and 1_1 respectively are selected and connected to their common bit lines in order to carry out electrical pre-charge processes. It is to be noted that the number of bit lines to be selected can be determined arbitrarily. That is to say, the number of bit lines to be selected is an arbitrary number in a range between a minimum value of 0 and a maximum value of 6.

In a period between times T2 and T3, a read voltage VR is generated. The magnitude of the read voltage VR is determined by almost a ratio of a pre-charging bit-line count to a charge-sharing bit-line count. In this case, the pre-charging bit-line count is the number of bit lines subjected to the electrical pre-charge process whereas charge-sharing bit-line count is the number of bit lines sharing electric charge accumulated in the electrical pre-charge process.

At the time T3, the electric potentials appearing on the read-object bit line BL0<0> and the reference word line Ref.WL in the memory block 1_0 are raised to the high level at the same time. Thus, a cell current of the read time flows to a memory cell MC whereas a reference current flows to a reference memory cell MCr.

The resistance of the reference resistor Rer of the reference memory cell MCr has been set at a value between the resistance of the variable-resistance storage element Re in the HRS and the resistance of the variable-resistance storage element Re in the LRS. Thus, as is obvious from the waveform shown in FIG. 19E, the electric potentials appearing on the bit lines and the reference bit line change.

FIG. 20D shows a discharge curve for the LRS whereas FIG. 21D shows a discharge curve for the HRS.

At a time T4, the electric potential of the bit-line isolation signal BLI decreases while the electric potential of the SA enable signal SAEN increases so that the sensing operation of the SA (sense amplifier) 7 is started.

In the case of the LRS, the electric potential appearing on the common bit line CBL0 connected to the memory cell MC makes a transition on the low side. Thus, after the sensing operation has been completed, the electric potential appearing on the common bit line CBL0 connected to the memory cell MC is pulled down to the reference voltage Vss. In the case of the HRS, on the other hand, the electric potential appearing on the common bit line CBL0 connected to the memory cell MC makes a transition on the high side. Thus, after the sensing operation has been completed, the electric potential appearing on the common bit line CBL0 connected to the memory cell MC is pulled up to the power-supply voltage Vdd.

It is to be noted that, contrary to the operation described above, if a memory cell MC in the memory block 1_1 is selected, the reference resistor Rer in the memory block 1_0 is selected.

The basic operation is the same as the operation described above.

In the case of the first embodiment, the SA (sense amplifier) 7 has a configuration like the one shown in FIG. 10. However, the read voltage VR has to be supplied so that it cannot be said that an analog voltage is not required at all.

In the case of the second embodiment, on the other hand, due to an electrical discharge process of a reference memory cell, an analog reference voltage is automatically generated so that it is possible to carry out a differential read operation making use of a dynamically changing reference voltage. Thus, it is not necessary to supply the read voltage VR from a source external to the SA (sense amplifier) 7 and it is therefore unnecessary to supply an analog voltage at all. As a result, it is possible to carry out a read-to-verify operation consuming small electric power.

3: Third Embodiment

In the case of the first embodiment, one memory block is connected to one SA (sense amplifier) 7. However, it is also possible to provide a configuration in which a number of memory blocks are provided in advance and a memory block to be connected to the sense amplifier 7 can be selected arbitrarily from the numerous memory blocks provided in advance. Such a configuration provides more generality and allows fine control to be carried out on the read voltage VR.

A third embodiment provides a memory-cell array with a structure which gives better generality and finer setting of the read voltage VR.

Figure 22:
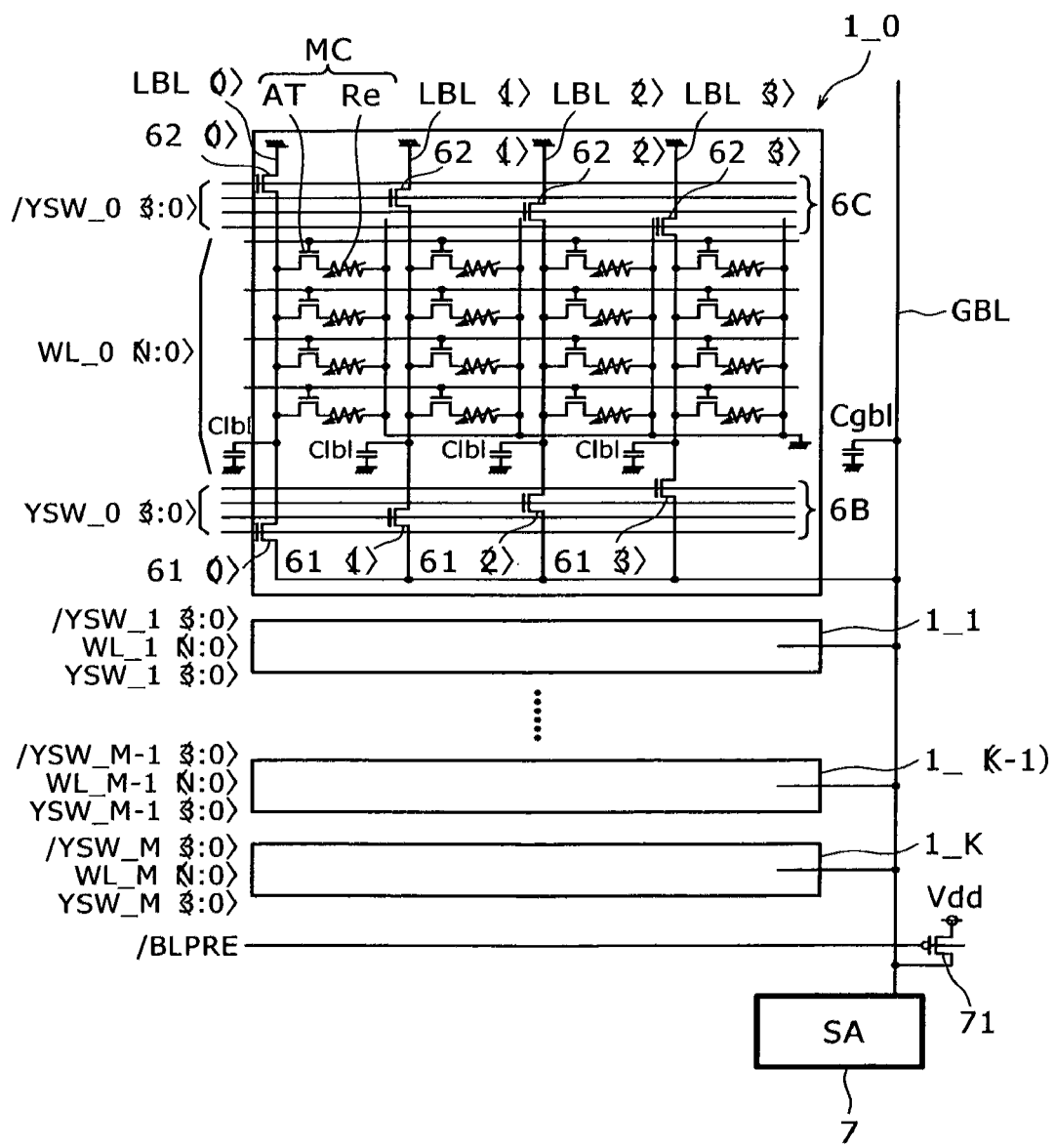
FIG. 22 is a diagram showing the configuration of a memory-cell array according to a third embodiment as well as connections between a sense amplifier and memory blocks.

FIG. 22 is a diagram showing the configuration of a memory-cell array according to a third embodiment as well as connections between a sense amplifier 7 and memory blocks.

This embodiment has a configuration in which a plurality of memory blocks are connected in parallel to one shared bit line. In the following description, the shared bit line to which a plurality of memory blocks are connected in parallel is referred to as a global bit line GBL and a bit line BL in each of the memory blocks is referred to as a local bit line LBL.

The third embodiment is configured so that, in every memory block having N rows and four columns, the global bit line GBL and the local bit lines LBL<3:0> can be connected to each other selectively by making use of the isolation switches 61<3:0> of the common-line isolation switch section 6B. The local bit lines LBL<3:0> can be selected as an electrical discharging object by making use of the discharging switches 62<3:0> of the discharge switch 6C.

In this embodiment, as shown in FIG. 22, (K-1) memory blocks each having such a configuration are connected in parallel to the same global bit line GBL common to the memory blocks. The (K-1) memory blocks are denoted by reference numerals 1_0, 1_1, 1_(K-1) and 1_K respectively.

In the design of such a hierarchical structure of bit lines BL, for all memory blocks, the memory-cell row count N and the memory-cell column count M can each be set at any arbitrary number. In addition, the memory-block count K can also be set at any arbitrary number.

Much like the SA (sense amplifier) 7 employed in the memory-cell array 1 shown in FIG. 5, the SA (sense amplifier) 7 connected to the global bit line GBL is also a sense amplifier of the single-end type and it is thus necessary to supply the reference electric potential VREF to the sensing node of the SA (sense amplifier) 7 from an external source.

Much like the common bit line CBL0 employed in the memory-cell array 1 shown in FIG. 5, the global bit line GBL is connected to the pre-charge transistor 71 controlled by the inverted BL pre-charge signal /BLPRE supplied to the gate electrode of the pre-charge transistor 71.

FIGS. 23A to 23H are timing diagrams showing waveforms for operations for a case in which setting of the read voltage VR is carried out on arbitrary local bit lines of all memory blocks and a word line WL_0<0> of a memory block 1_0 is taken as the word line WL of a read object.

Figure 23:
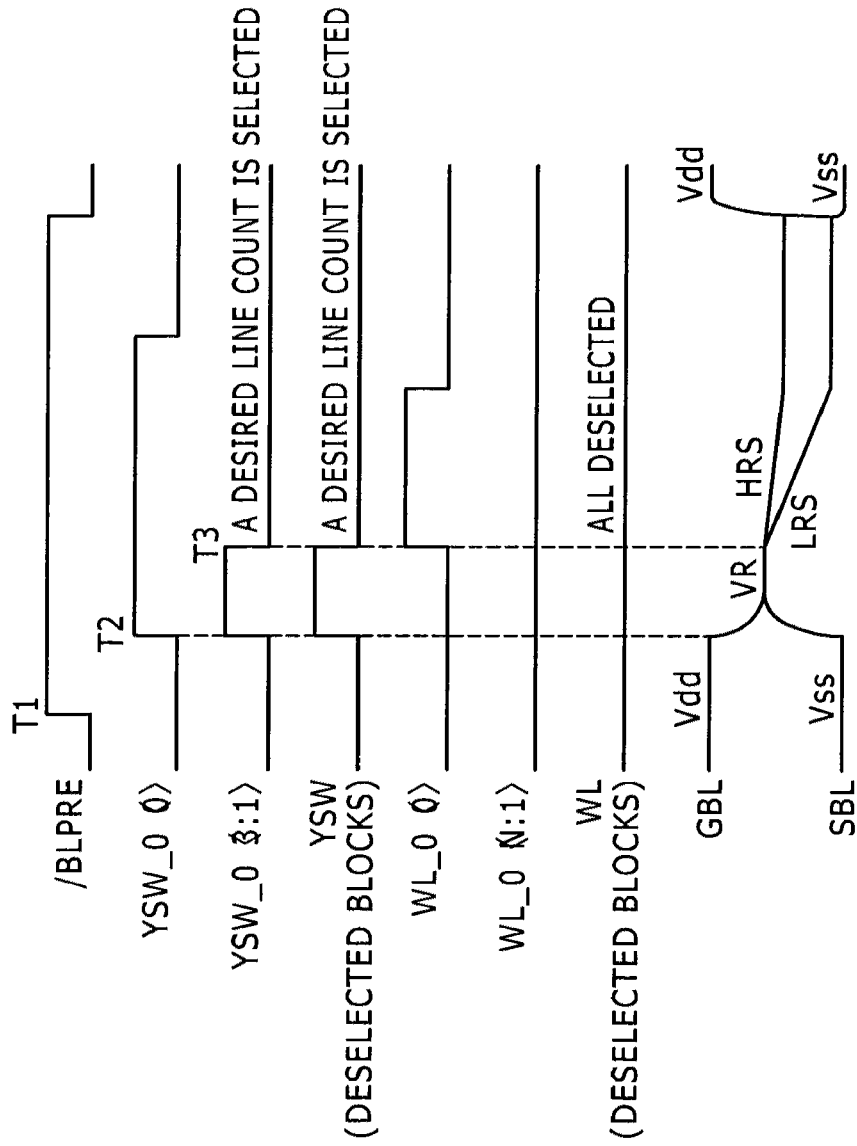
FIGS. 23A to 23H are timing diagrams showing waveforms for operations for a case in which setting of the read voltage is carried out on arbitrary local bit lines of all memory blocks and a word line WL_0<0> of a memory block 1_0 is taken as the word line WL of a read object.

At a time T1 on a waveform shown in FIG. 23A, the global bit line GBL is electrically pre-charged to the power-supply voltage Vdd. At that time, all the local bit lines LBL of all the memory blocks are in a state of being disconnected from the global bit line GBL. Thus, the power-supply voltage Vdd is electrically pre-charged to only the global bit line GBL. The local bit lines LBL have been electrically discharged and set at the reference voltage Vss in advance.

At a time T2 on a waveform shown in FIG. 23B, arbitrary local bit lines LBL including the local bit line LBL_0<0> of the memory block 1_0 are selected. To put it in detail, the selected local bit lines LBL include the local bit line LBL_0<0> controlled by the column select line YSW_0<0> serving as a read object and other local bit lines LBL which are controlled by the column select lines YSW_0<3:1> of the same memory block 1_0 as the column select line YSW_0<0> and the column select lines YSW_i<3:0> of other memory blocks where i is an integer in the range 1 to M. These local bit lines LBL are selected by activating their respective column select lines YSW.

By selecting these local bit lines LBL, the electrically pre-charged electric charge is electrically discharged to the selected local bit lines LBL in order to share the electric charge with the selected local bit lines LBL. Thus, a read voltage VR having a magnitude determined in advance is set on each of the selected local bit lines LBL.

After the process of sharing the electric charge has been carried out, the voltage appearing on the local bit line LBL attenuates from the voltage appearing at a pre-charge time to the read voltage VR having a magnitude determined in advance by a ratio of wire capacitances.

The read voltage VR obtained as a result of the attenuation is expressed by Eq. (2) given as follows:

$$VR = Vdd \times Cgbl/(Cgbl + Clbl \times Nvss) \quad (2)$$

In Eq. (2), symbol Cgbl denotes the capacitance of the global bit line GBL whereas symbol Clbl denotes the capacitance of each local bit line LBL. In addition, symbol Nvss denotes the number of bit lines BL sharing the electric charge after being reset at the reference voltage Vss in an electrical discharge process.

Then, the resistance of the variable-resistance storage element Re is read out from a memory cell MC connected to the local bit line LBL_0<0> selected by the column select line YSW_0<0>.

To put it concretely, at a time T3 shown in FIGS. 23A to 23H, all column select lines other than the column select line YSW_0<0> are set at the L level representing the state of being deactivated. Thus, all the column select lines other than the local bit line LBL_0<0> are disconnected from the global bit line GBL.

At the time t3, only the word line WL_0<0> in the memory block 1_0 is raised to the H level. Thus, an electrical discharge process allowing a cell current to flow is carried out at a speed depending on whether the variable-resistance storage element Re of the memory cell MC connected to the word line WL_0<0> is in the LRS or the HRS.

In the same way as the first embodiment, the SA (sense amplifier) 7 of the single-end type is activated to sense the electric potential of a voltage appearing on the local bit line LBL being subjected to the electrical discharge process through the global bit line GBL.

In this embodiment, the capacitance of the global bit line GBL is much greater than the capacitances of local bit lines LBL so that the electrical pre-charge process is carried out on the global bit line GBL only. If it is desired to further increase the amount of electrically pre-charged electric charge, however, any arbitrary number of local bit lines LBL can be taken as an additional electrical pre-charge object.

In this embodiment, as is obvious from FIG. 22, the number of local bit lines LBL that can be subjected to sharing of electric charge is extremely large. Thus, it is possible to set any arbitrary reference electric potential VREF at fine steps in accordance with Eq. (2) given above.

4: Fourth Embodiment

In accordance with a fourth embodiment, there is proposed a configuration capable of carrying out a differential read operation within the hierarchical structure implemented by the third embodiment as a structure of bit lines BL.

Figure 24:
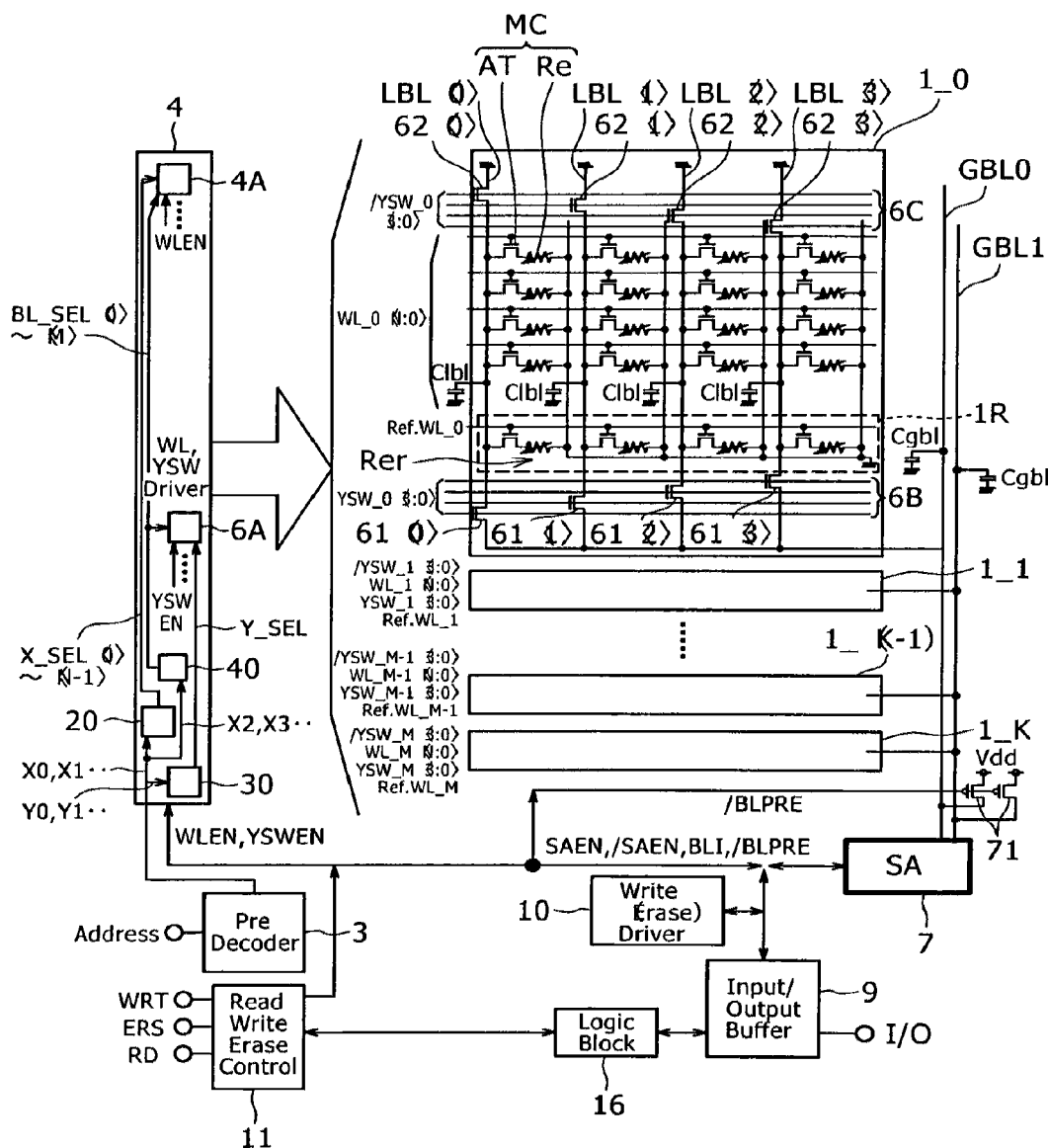
FIG. 24 is a block diagram showing the configuration of a variable-resistance memory device implemented typically as an IC chip.
Figure 25:
FIGS. 25A to 25K are timing diagrams showing waveforms for typical operations carried out in a fourth embodiment.

FIG. 24 is a block diagram showing the configuration of a variable-resistance memory device implemented typically as an IC chip.

K memory blocks exist as is the case with the third embodiment shown in FIG. 22. Each of the memory blocks includes a memory-cell row having reference memory cells MCr as is the case with the third embodiment shown in FIG. 17. Reference notation 1R in FIG. 24 denotes a reference section which is the memory-cell row having reference memory cells MCr.

The structure of a memory-cell array employed in the variable-resistance memory device shown in FIG. 24 is different from those shown in FIGS. 22 and 17 in that, in the case of the structure shown in FIG. 24, the K memory blocks are provided with two global bit lines, i.e., a global bit line GBL0 connected to odd-numbered memory blocks and a global bit line GBL1 connected to even-numbered memory blocks.

The global bit lines GLB0 and GLB1 correspond to respectively the common bit lines CBL0 and CBL1 employed in the variable-resistance memory device shown in FIG. 17. When one of the global bit lines GLB0 and GLB1 is connected to memory cells MC on the read side, the other global bit line is subjected to control to make connection with reference memory cells MCr. That is to say, in the case of the fourth embodiment, the common bit lines CBL0 and CBL1 employed in the variable-resistance memory device shown in FIG. 17 are put in a hierarchical structure and each of the common bit lines CBL0 and CBL1 is assigned to (K/2) memory blocks connected in parallel to the common bit line.

The variable-resistance memory device shown in FIG. 24 newly includes an additional block decoder 40 in the row driving circuit 4 to serve as a decoder for selecting a memory block.

The block decoder 40 typically receives address bits X2 and X3 to be decoded in order to select a memory block in place of the address bits X0 and X1 of the configuration shown in FIG. 6. The block decoder 40 then outputs memory-block select signals from the outputs of inverters INV4 to INV7. The memory-block select signals are supplied to the WL driver unit 4A and the CSW driver unit 6A which are associated with one of the memory blocks.

FIGS. 25A to 25K are timing diagrams showing waveforms for typical operations carried out in the fourth embodiment.

In these typical operations, at a time T1, the global bit lines GBL0 and GBL1 are electrically pre-charged to the power-supply voltage Vdd.

Then, the electric charge electrically pre-charged to the global bit lines GBL0 and GBL1 is electrically discharged to any arbitrary number of local bit lines LBL including the local bit line LBL<0> of the memory block 1_0 which is the first one of the odd-numbered memory blocks in order to share the electric charge with the local bit lines LBL. In the case of a waveform shown in FIG. 25C, the local bit line LBL<0> of the memory block 1_1 which is the first one of the even-numbered memory blocks and the local bit line LBL<0> of the memory block 1_0 are taken as lines used for sharing the electric charge. However, any other arbitrary local bit lines LBL can also be taken as lines used for sharing the electric charge.

The local bit lines LBL taken as lines used for sharing the electric charge can be selected arbitrarily from any memory blocks. In addition, the number of local bit lines LBL selected arbitrarily from any memory blocks to be used as lines for sharing the electric charge is also arbitrary.

The read voltage VR is expressed by Eq. (2). As shown by this equation, the magnitude of the read voltage VR is determined by wire capacitances according to the number of local bit lines LBL selected arbitrarily from any memory blocks to be used as lines for sharing the electric charge.

In this case, the local bit line LBL<0> of the memory block 1_0 is taken as an object from which data is to be read out whereas a reference memory cell MCr in the memory block 1_1 is taken as an object from which a reference electric potential is to be read out. Thus, as is obvious from waveforms shown in FIGS. 25G and 25H, the electric potentials appearing on two word lines WL are activated.

Therefore, the dynamically decreasing electric potential of the global bit line GBL1 connected to the reference memory cell MCr is taken as a reference and, in a memory cell MC whose data is to be read out from the global bit line GBL0 in the HRS or LRS, the voltage level appearing in the course of an electrical discharge operation is sensed in a differential sensing operation.

The method for selecting a reference memory cell MCr, the positions of local bit lines LBL to share electric charge and the number of such local bit lines LBL can be determined arbitrarily. In addition, any arbitrary number of local bit lines LBL can be added as an electrical pre-charge object.

In accordance with the fourth embodiment, a stable operation based on differential sensing can be carried out to accompany fine setting of the read voltage VR with a broad adjustment range. Thus, even if the resistance of the variable-resistance storage element Re changes with the lapse of time, while a read voltage VR proper for the change of the resistance is being adjusted finely, a read operation can be carried out at a high speed and with a high degree of reliability.

5: Fifth Embodiment

Figure 26:
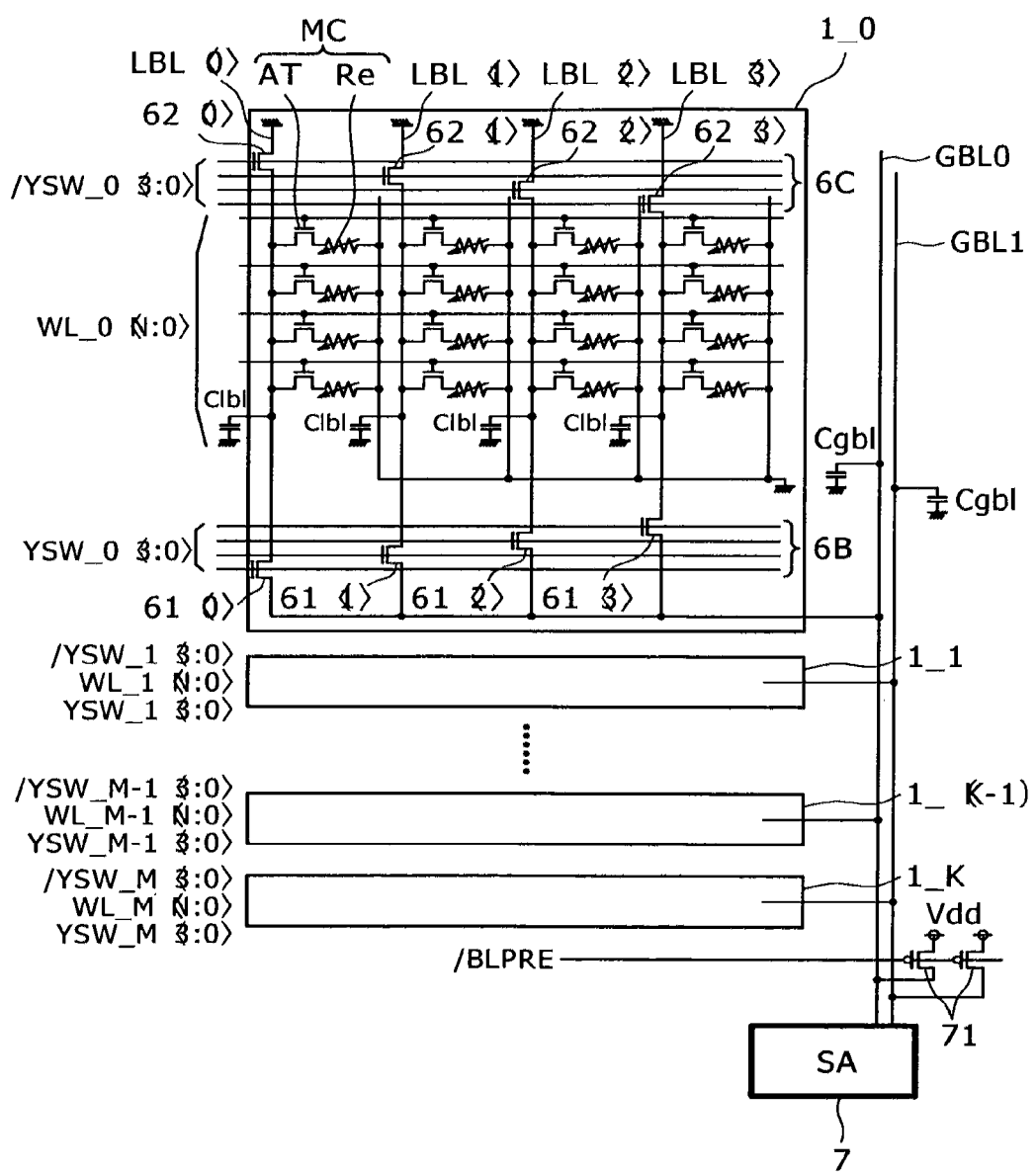
FIG. 26 is a block diagram showing the configuration of a memory-cell array according to a fifth embodiment.

FIG. 26 is a block diagram showing the configuration of a memory-cell array according to a fifth embodiment. The memory-cell array according to a fifth embodiment shown in FIG. 26 is different from the memory-cell array according to the fourth embodiment shown in FIG. 24 in that, in the case of the fifth embodiment, each memory block does not include the reference section 1R.

In the case of the fifth embodiment, the reference electric potential cannot be changed dynamically by making use of a reference memory cell MCr to follow the electric potential generated by the memory cell MC.

In the case of the fifth embodiment, in order to control the reference electric potential to a level between the level of the HRS and the level of the LRS, a reference voltage generated as a result of electric-charge sharing is used instead of making use of an analog voltage generated by an external source.

FIGS. 27A to 27H are timing diagrams showing waveforms for typical operations carried out in accordance with the fifth embodiment.

Figures 27A, 27B, 27C, 27D, 27E, 27F, 27G, 27H:
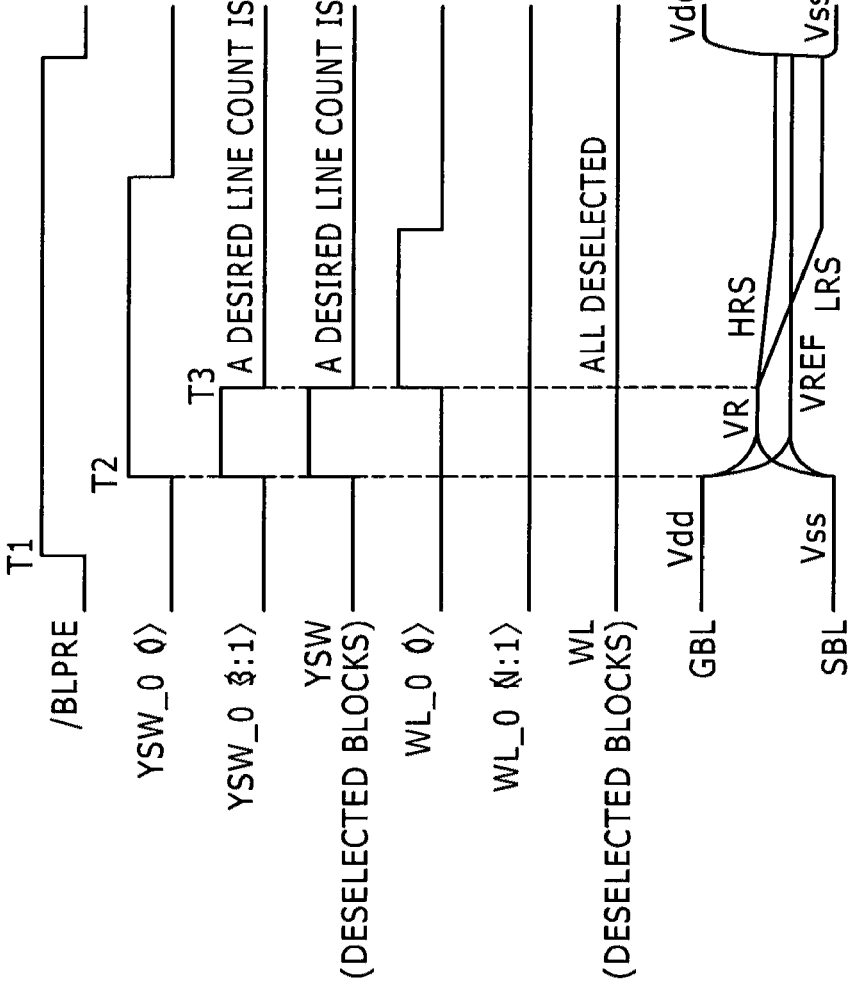
FIGS. 27A to 27H are timing diagrams showing waveforms for typical operations carried out in accordance with the fifth embodiment.

In the case of the fifth embodiment, from the necessity to set the read voltage VR, the local bit line LBL<0> associated with the column select signal YSW_0<0> shown in FIG. 27B to serve as a read object is taken as an object of the electric-charge sharing process. However, local bit lines other than the local bit line LBL<0> can also be selected arbitrarily to serve an object of the electric-charge sharing process.

In this case, the electric potential of the read voltage VR is determined by the number of local bit lines LBL connected to the global bit line GBL0 whereas the electric potential of the reference electric potential VREF is determined by the number of local bit lines LBL connected to the global bit line GBL1.

With the reference electric potential VREF set at a proper level lower than the read voltage VR as shown by a waveform of FIG. 27H, the SA (sense amplifier) 7 of the single-end type carries out a voltage sensing operation.

In the system according to the fifth embodiment, the effect of variations on characteristics of the memory cell MC is big in comparison with the method of making use of a reference memory cell MCr. However, it is not necessary to provide reference memory cells MCr in every memory block. Thus, the bit cost can be reduced by a difference corresponding to the number of eliminated reference memory cells MCr. In addition, an analog voltage generated by a generator external to the memory-cell array is also not required. Thus, the power consumption can also be reduced as well by a difference corresponding to the external generator for generating the analog voltage.

6: Modifications

In the first to fifth embodiments described so far, the timing of the start of an electrical discharge process is determined by a trigger for activating a word line WL.

However, the timing of the start of an electrical discharge process does not have to be determined by a trigger for activating a word line WL. For example, the timing of the start of an electrical discharge process can also be determined by a trigger for activating a column select signal YSW.

FIGS. 28A to 28H are timing diagrams showing waveforms for operations carried out by a modified version of the third embodiment shown in FIGS. 23A to 23H.

At a time T1 in the operations represented by the waveforms shown in FIGS. 28A to 28H, the electric potential appearing on the word line WL_0<0> connected to a memory cell MC serving as a read object is raised in advance typically with a timing coincident with a timing to electrically precharge the global bit line GBL. At this stage, there is no difference in electric potential between the local bit line LBL and the source line SL. Thus, the read-time electrical discharge process of the memory cell MC is not started.

Later on, at a time T2, a first electric-charge sharing process is carried out on local bit lines LBL other than the local bit line LBL serving as a read object. At this stage, the final electric potential of the read voltage VR is not confirmed.

Then, at a time T3, electric charge after the first electric-charge sharing process is shared with a bit line BL serving as a read object. As a result, an electrical discharge process for one local bit line LBL further lowers the read voltage VR and a read-time cell current flows to the memory cell MC.

The eventual magnitude of the read voltage VR is lower by a downward difference than the electric potential determined by the first electric-charge sharing process. Since the magnitude of the downward difference has been estimated, however, the number of local bit lines LBL subjected to the first electric-charge sharing process can be determined by foreseeing the downward difference.

In the case of a verify operation initiated by a word-line trigger, the time constant of a word-line change is large due to a high layout density of word lines WL which are generally prescribed by a lower layer such as a poly-silicon layer. Thus, delaying of an electrical-discharge verify operation and dependence on the address of the electrical-discharge verify operation may occur in some cases. The dependence on the address of the electrical-discharge verify operation is a phenomenon in which, depending on the location of the memory-cell array, the effect of a change of a electric potential appearing on the word line WL on the delaying of an electrical-discharge verify operation is big so that the speed of the electrical discharge process varies.

In the case of the embodiments, the timing of the trigger generated by the column select signal YSW can be changed in order to change the timing of the start of the electrical discharge process so that, a uniform verify electric discharge process can be carried out in the memory-cell array in a rapid manner in comparison with the case of a verify operation initiated by a word-line trigger.

The present disclosure contains subject matter related to that disclosed in Japanese Priority Patent Application JP 2010-170934 filed in the Japan Patent Office on Jul. 29, 2010, the entire content of which is hereby incorporated by reference.

It should be understood by those skilled in the art that various modifications, combinations, sub-combinations and alterations may occur depending on design requirements and other factors in so far as they are within the scope of the appended claims or the equivalents thereof.

What is claimed is:

1. A variable-resistance memory device comprising:
   a memory-cell array employing a plurality of memory cells and a plurality of common lines, the plurality of common lines each respectively connected to a predetermined number of bit lines, each of the plurality of memory cells including a storage element having a resistance varying in accordance with the direction of a voltage applied to said storage element and including an access transistor connected in series to said storage element between one of the bit lines and one of the source lines; and a voltage supplying circuit for setting a read voltage used for reading out said resistance of said storage element on a selected bit line connected to said memory cell serving as a read object in an operation to supply said read voltage to said selected bit line by electrically pre-charging a common line of said plurality of common lines and the selected bit line, said selected bit line being coupled to said common line, and discharging pre-charge voltage of said selected bit line to share charge with unselected bit lines of the predetermined number of bit lines connected to the common line.

2. The variable-resistance memory device according to claim 1 wherein said voltage supplying circuit comprises:

a pre-charge section configured to electrically pre-charge electric charge to said common line or any arbitrary number of said bit lines connected to said common line;

a switch group configured to control connections between said common line and said bit lines;

a switch control section configured to control said switch group so as to electrically discharge said electric charge electrically pre-charged by said pre-charge section to at least another one of said bit lines in order to share said electric charge with said other bit lines in a process of setting a magnitude of said read voltage; and a sense amplifier configured to sense an electric potential appearing on said common line.

3. The variable-resistance memory device according to claim 2 wherein:

a plurality of memory blocks each having a plurality of said memory cells laid out to form a matrix are connected to said common line;

said bit lines in each of said memory blocks form a hierarchical structure with respect to said common line; and a plurality of said common lines with respect to which said bit lines form a hierarchical structure are connected to said sense amplifier.

4. The variable-resistance memory device according to claim 3 wherein said sense amplifier:

takes an electric potential supplied by a specific one of said memory blocks through said common line for said specific memory block as a reference; and senses the magnitude of a bit-line electric potential supplied by another one of said memory blocks through said common line for said other memory block.

5. The variable-resistance memory device according to claim 4 wherein:

said memory block is configured to include reference memory cells each connected to one of said bit lines; and said sense amplifier carries out a differential sensing operation to sense the magnitude of a change of an electric potential appearing on said selected bit line by taking an electric potential appearing on said common line connected to said reference memory cell as a reference.

6. The variable-resistance memory device according to claim 5 wherein, with a word line for controlling connection between said memory cell and said selected bit line put in a state of being selected, said switch control section carries out said electric-charge sharing process on any arbitrary number of said bit lines other than said selected bit line to share electric charge with said other bit lines and, then, controls said switch group to electrically discharge some of said electric charge shared with said other bit lines to said selected bit line in order to supply said read voltage to said selected line and start an electrical discharge process to be carried out on said memory cell on the basis of a cell current.

7. The variable-resistance memory device according to claim 6 wherein said sense amplifier includes a load isolation switch for isolating said common line connected to said bit line to serve as a load from a sense node in a process of further amplifying the amplitude of an electric potential appearing on said bit line after occurrence of a change of said electric potential.

8. The variable-resistance memory device according to claim 4 wherein said sense amplifier is a single-end sense amplifier which takes a read voltage set by carrying out said electric-charge sharing process on one of said memory blocks as a reference in a voltage sensing operation carried out to detect the magnitude of a change of an electric potential appearing on said selected bit line in another one of said memory blocks.

9. The variable-resistance memory device according to claim 4 wherein said sense amplifier is a single-end sense amplifier which inputs a reference electric potential from an external source or inputs a reference electric potential generated internally and, by taking said reference electric potential as a reference, carries out a voltage sensing operation to detect the magnitude of a change of an electric potential appearing on said selected bit line.

10. The variable-resistance memory device according to claim 2 wherein, from a plurality of said bit lines connected to said common line, said switch control section selects said bit line connected to said memory cell serving as a read object and selects said bit lines to be subjected to said electric-charge sharing process.

11. The variable-resistance memory device according to claim 1 wherein said memory cell is a variable-resistance memory cell having, between two electrodes, a conductive-ion supplying layer, and a variable-resistance layer, which is brought into contact with said conductive-ion supplying layer, and in accordance with the polarity of a voltage applied between said two electrodes, conductive ions are injected from said conductive-ion supplying layer into said variable-resistance layer or said conductive ions already injected into said variable-resistance layer are returned to said conductive-ion supplying layer.

* * * * *